(12) United States Patent
Kohda

(10) Patent No.: US 8,669,819 B2
(45) Date of Patent: Mar. 11, 2014

(54) ELECTRONIC COMPONENT PACKAGE SEALING MEMBER, ELECTRONIC COMPONENT PACKAGE, AND METHOD FOR MANUFACTURING ELECTRONIC COMPONENT PACKAGE SEALING MEMBER

(75) Inventor: Naoki Kohda, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 0 days.

(21) Appl. No.: 13/266,945

(22) PCT Filed: Mar. 4, 2011

(86) PCT No.: PCT/JP2011/055106
§ 371 (c)(1),
(2), (4) Date: Oct. 28, 2011

(87) PCT Pub. No.: WO2011/108715
PCT Pub. Date: Sep. 9, 2011

(65) Prior Publication Data
US 2012/0313721 A1 Dec. 13, 2012

(30) Foreign Application Priority Data
Mar. 4, 2010 (JP) ................................ 2010-048099

(51) Int. Cl.
*H03B 1/00* (2006.01)
(52) U.S. Cl.
USPC .......................................... 331/68; 331/158
(58) Field of Classification Search
USPC .................................................. 331/68, 158
See application file for complete search history.

(56) References Cited

U.S. PATENT DOCUMENTS

| | | | |
|---|---|---|---|
| 2002/0036546 A1* | 3/2002 | Hatanaka et al. | 331/68 |
| 2005/0014397 A1 | 1/2005 | Brown | |
| 2008/0036086 A1 | 2/2008 | Ishio | |
| 2009/0127698 A1 | 5/2009 | Matsumoto | |
| 2011/0255378 A1* | 10/2011 | Funabiki et al. | 368/47 |
| 2012/0235761 A1* | 9/2012 | Mitome et al. | 331/158 |

FOREIGN PATENT DOCUMENTS

| | | |
|---|---|---|
| JP | 2002-353632 A | 12/2002 |
| JP | 2004-214787 A | 7/2004 |
| JP | 2005-191740 A | 7/2005 |
| JP | 2006-196619 A | 7/2006 |
| JP | 2008-047652 A | 2/2008 |
| WO | WO 2007/040051 A1 | 4/2007 |

* cited by examiner

*Primary Examiner* — Joseph Chang
(74) *Attorney, Agent, or Firm* — Marvin A. Motsenbocker; Mots Law, PLLC

(57) ABSTRACT

An electronic component package sealing member that can be used as a first sealing member in an electronic component package in which an electrode of an electronic component element is hermetically sealed with the first sealing member and a second sealing member arranged so as to oppose each other, includes: a through hole that passes through a substrate of the electronic component package sealing member; an internal electrode that is formed on a face of the substrate opposing the second sealing member; an external electrode that is formed on a face of the substrate opposite the opposing face; and a through electrode that is formed on an inner side face of the through hole electrically connecting the internal electrode and the external electrode. In the electronic component package sealing member, at least one open face of the through hole is sealed with a resin material.

17 Claims, 39 Drawing Sheets

ELECTRONIC COMPONENT PACKAGE SEALING MEMBER, ELECTRONIC COMPONENT PACKAGE, AND METHOD FOR MANUFACTURING ELECTRONIC COMPONENT PACKAGE SEALING MEMBER

TECHNICAL FIELD

The present invention relates to an electronic component package sealing member that can be used as a first sealing member of an electronic component package in which an electrode of an electronic component element is sealed with the first sealing member and a second sealing member that are arranged so as to oppose each other, an electronic component package using the electronic component package sealing member, and a method for manufacturing the electronic component package sealing member.

BACKGROUND ART

The internal space of an electronic component package is hermetically sealed in order to prevent the properties of an electrode of an electronic component element mounted in this internal space from deteriorating. Examples of such an electronic component package in which the internal space is hermetically sealed include piezoelectric resonator devices of crystal resonators and the like.

This sort of electronic component package may be configured from two sealing members consisting of a base and a lid, and its casing may be formed into a package in the shape of a rectangular solid. In the internal space of such a package, an electronic component element such as a piezoelectric resonator plate is held by and bonded to the base. When the base and the lid are bonded to each other, an electrode of the electronic component element in the internal space of the package is hermetically sealed (see Patent Document 1, for example).

A base of a crystal resonator package (i.e., electronic component package) as shown in Patent Document 1 includes a through hole that passes through the substrate of this base. Electrodes arranged on two main faces of the base are electrically connected to each other via this through hole.

The through hole disposed in such a base is filled with a conductive member, and, when this conductive member is connected to the electrodes arranged on the two main faces of the base, the electrodes arranged on the two main faces are electrically connected to each other, and the internal space of the package is kept airtight. Here, as the conductive member, Patent Document 1 discloses a silver paste and a metal member that is to be fitted to the through hole.

PRIOR ART DOCUMENT

Patent Document

Patent Document 1: JP 2002-124845A

SUMMARY OF INVENTION

Problem to be Solved by the Invention

Here, in recent years, it is required to reduce the size of an electronic component package such as a piezoelectric resonator device, and, according to this request, there is a trend that the size of a through hole disposed in a sealing member such as a base as described above is reduced.

However, generally, a conductive paste such as a silver paste as disclosed in Patent Document 1 is highly viscous, and, thus, it is difficult to fill a minute through hole with the paste. Furthermore, in the case where a metal member is used for filing a minute through hole as the conductive member, it is difficult to manufacture a minute metal member that is in close contact with the minute through hole.

Accordingly, when filling a minute through hole with a conductive paste or a metal member, a filling failure may occur. With such a filling failure, the through hole is not completely sealed, and, thus, airtightness of the internal space of the package may become poor.

The present invention was achieved in view of these circumstances, and it is an object thereof to provide an electronic component package sealing member that, when used as a sealing member of an electronic component package, can make the internal portion of the electronic component package sufficiently airtight.

It is another object of the present invention to provide an electronic component package in which the internal portion of the package is kept sufficiently airtight.

It is another object of the present invention to provide a method for manufacturing an electronic component package sealing member that, when used as a sealing member of an electronic component package, can make the internal portion of the electronic component package sufficiently airtight.

Means for Solving the Problems

In order to achieve the above-described objects, the present invention is directed to an electronic component package sealing member that can be used as a first sealing member in an electronic component package in which an electrode of an electronic component element is hermetically sealed with the first sealing member and a second sealing member arranged so as to oppose each other, including: a through hole that passes through a substrate of the electronic component package sealing member; an internal electrode that is formed on a face of the substrate opposing the second sealing member; an external electrode that is formed on a face of the substrate opposite the opposing face; and a through electrode that is formed on an inner side face of the through hole electrically connecting the internal electrode and the external electrode; wherein at least one open face of the through hole is sealed with a resin material.

With this configuration, the through electrode that is formed along the inner side face of the through hole electrically connects the internal electrode and the external electrode, and a stable conduction state at the through hole is realized. Furthermore, since at least one open face of the through hole is sealed with a resin material, the internal portion of an electronic component package using the electronic component package sealing member can be made sufficiently airtight. Here, formation of an electrode (the internal electrode, the external electrode, and the through electrode) on the substrate of the electronic component package sealing member in the present invention corresponds to a wider concept that includes not only an operation that directly forms an electrode on the substrate surface but also an operation that forms an electrode on the substrate surface with some substance interposed between them.

Furthermore, in the electronic component package sealing member according to the present invention, the resin material may be photosensitive, and the at least one open face of the through hole may be sealed with a resin pattern made of the resin material disposed on the open face.

With this configuration, at least one open face of the through hole is reliably sealed with a resin pattern made of a photosensitive resin material that is disposed on this open face. Such a resin pattern is easily and precisely formed, for example, by photolithography using a photosensitive resin material, and can make the internal portion of an electronic component package using the electronic component package sealing member sufficiently airtight.

Furthermore, in the electronic component package sealing member according to the present invention, an internal portion of the through hole may be filled with a resin material.

With this configuration, since through hole is reliably sealed with a resin material filled in this through hole, the internal portion of an electronic component package using the electronic component package sealing member reliably can be made sufficiently airtight.

Furthermore, in the electronic component package sealing member according to the present invention, a surface of at least part of the internal electrode may be coated with a resin material.

With this configuration, the surface of at least part of the internal electrode is coated with a resin material. Thus, in a case where the electrode surface of the part of the internal electrode coated with a resin material is made of metal that is easily oxidized (e.g., Cu), the electrode surface can be prevented from being oxidized.

Furthermore, in the electronic component package sealing member according to the present invention, a surface of at least part of the external electrode may be coated with a resin material.

With this configuration, the surface of at least part of the external electrode is coated with a resin material. Thus, in a case where the electrode surface of the part of the external electrode coated with a resin material is made of metal that is easily oxidized (e.g., Cu), the electrode surface can be prevented from being oxidized.

Furthermore, in the electronic component package sealing member according to the present invention, a resin material may be interposed between the substrate, and each of the internal electrode, the external electrode, and the through electrode.

With this configuration, since a resin material is interposed between the substrate of the electronic component package sealing member, and each of the internal electrode, the external electrode, and the through electrode, metals forming the internal electrode, the external electrode, and the through electrode and the substrate of the electronic component package sealing member are prevented from being reacted with each other, and the substrate of the electronic component package sealing member is prevented from deteriorating due to a reaction with the metals forming the internal electrode, the external electrode, and the through electrode.

Furthermore, in the electronic component package sealing member according to the present invention, another electrode may be formed via a resin material on at least one of the internal electrode and the external electrode.

With this configuration, a plurality of wiring patterns can be arranged in the thickness direction of the electronic component package sealing member.

Furthermore, the present invention is directed to an electronic component package in which an electrode of an electronic component element is hermetically sealed with a first sealing member and a second sealing member arranged so as to oppose each other, wherein the first sealing member is the electronic component package sealing member according to any one of the aspects of the present invention described above.

With this configuration, since the electronic component package sealing member according to any one of the aspects of the present invention described above is used as the first sealing member, the electronic component package sealing member can keep the internal portion of the package sufficiently airtight. Furthermore, a stable conduction state at the through hole that is disposed in this electronic component package sealing member is secured.

Furthermore, the present invention is directed to a manufacturing method for manufacturing an electronic component package sealing member that is used as a first sealing member in an electronic component package in which an electrode of an electronic component element is hermetically sealed with the first sealing member and a second sealing member arranged so as to oppose each other, including: a through hole forming step of forming a through hole that passes through a substrate of the electronic component package sealing member; an electrode forming step of forming, on the substrate, an internal electrode that is positioned on a face opposing the second sealing member, an external electrode that is positioned on a face opposite the opposing face, and a through electrode that is along an inner side face of the through hole; and a hole sealing step of sealing at least one open face of the through hole with a resin material.

With this manufacturing method, since a through electrode that is along the inner side face of the through hole is formed in the electrode forming step, it is possible to manufacture an electronic component package sealing member in which the through electrode electrically connects the internal electrode and the external electrode, and a stable conduction state at the internal portion of the through hole is realized. Furthermore, since this method includes a hole sealing step of sealing at least one open face of the through hole with a resin material, it is possible to manufacture an electronic component package sealing member that, when used as a first sealing member of an electronic component package, can make the internal portion of the electronic component package sufficiently airtight.

Furthermore, in the method for manufacturing an electronic component package sealing member according to the present invention, the hole sealing step may include a step of patterning a resin pattern for sealing at least one open face of the through hole by photolithography using the resin material that is photosensitive.

With this manufacturing method, a resin pattern can be easily and precisely formed by photolithography using a photosensitive resin material, and, thus, at least one open face of the through hole can be reliably sealed with the resin pattern.

Effects of the Invention

According to the electronic component package sealing member of the present invention, it is possible to provide an electronic component package sealing member that, when used as a sealing member of an electronic component package, can make the internal portion of the electronic component package sufficiently airtight.

Furthermore, according to the electronic component package of the present invention, it is possible to provide an electronic component package in which airtightness of the internal portion of the package is sufficiently secured.

Furthermore, according to the method for manufacturing an electronic component package sealing member of the present invention, it is possible to manufacture an electronic component package sealing member that, when used as a sealing member of an electronic component package, can make the internal portion of the electronic component package sufficiently airtight.

DESCRIPTION OF EMBODIMENTS

Hereinafter, Embodiments 1 to 6 of the present invention will be described with reference to the drawings. Here, Embodiments 1 to 4 and 6 below describe a case in which an electronic component package of the present invention is applied to a package of crystal resonator that is a piezoelectric resonator device, and an AT-cut crystal resonator plate that is a piezoelectric resonator plate is used as an electronic component element. Furthermore, Embodiment 5 describes a case in which the electronic component package of the present invention is applied to a package of a crystal oscillator that is a piezoelectric resonator device, and an AT-cut crystal resonator plate that is a piezoelectric resonator plate and an IC chip are used as electronic component elements.

Embodiment 1

Figure 1:
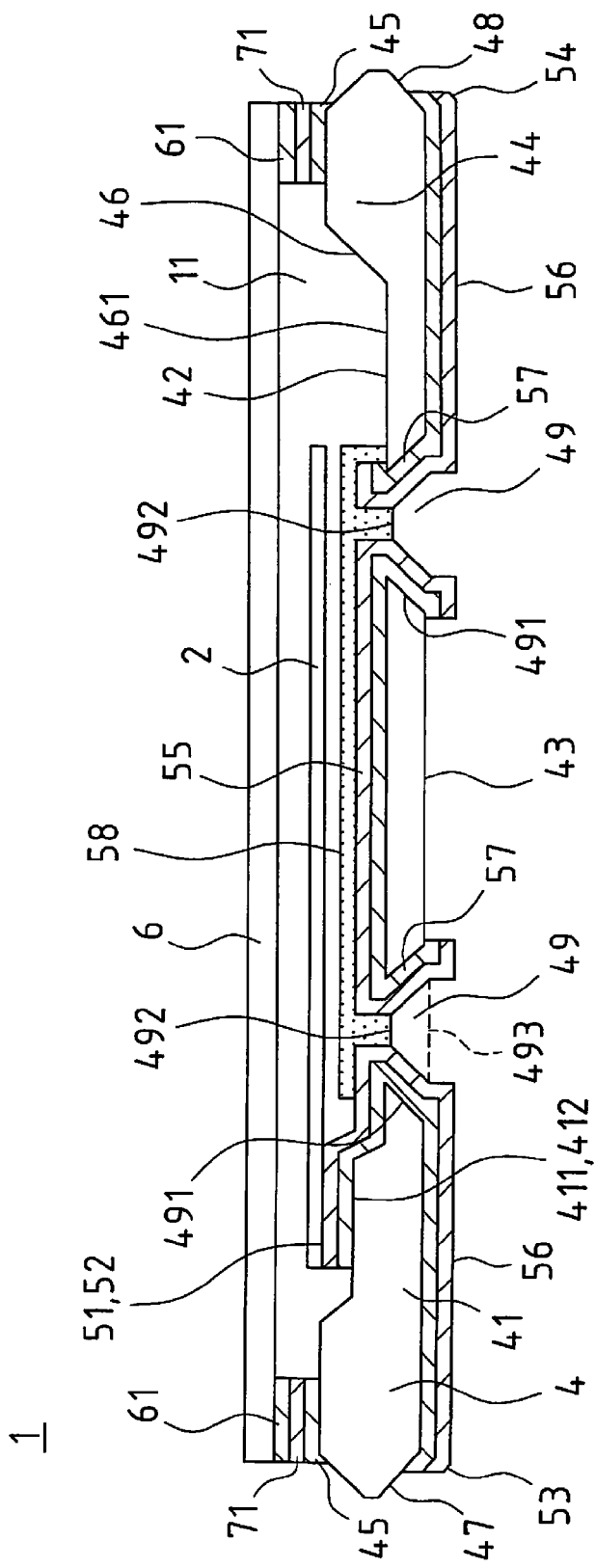
FIG. 1 is a schematic cross-sectional view showing an internal space of a crystal resonator according to Embodiment 1, the crystal resonator being cut through along the dashed dotted line of a base shown in FIG. 2A.
Figure 2A:
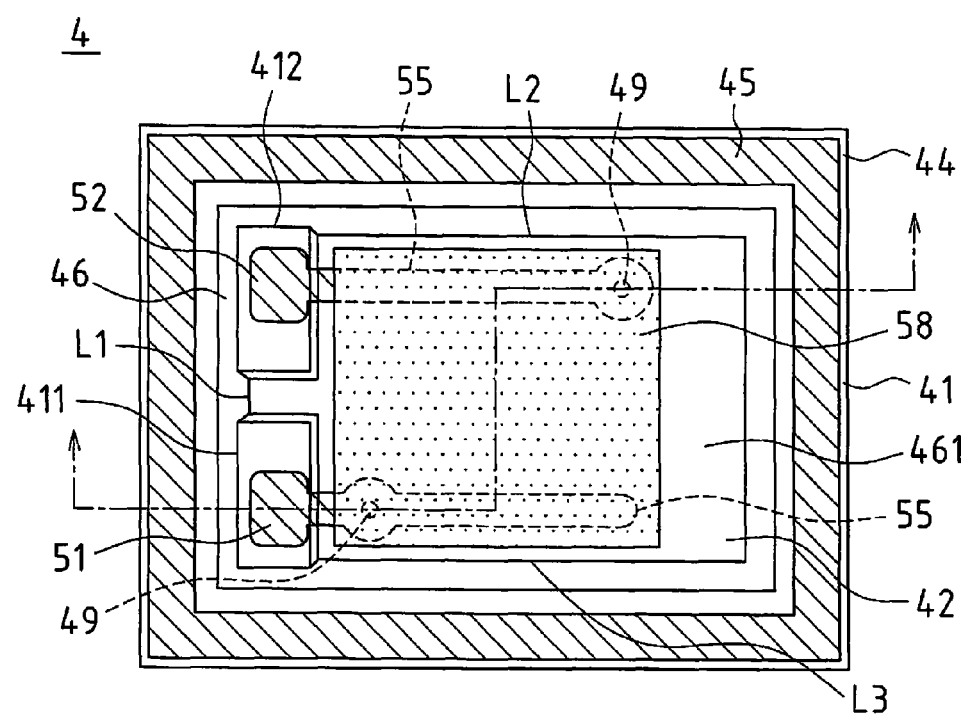
FIG. 2A is a schematic plan view of the base according to Embodiment 1.
Figure 2B:
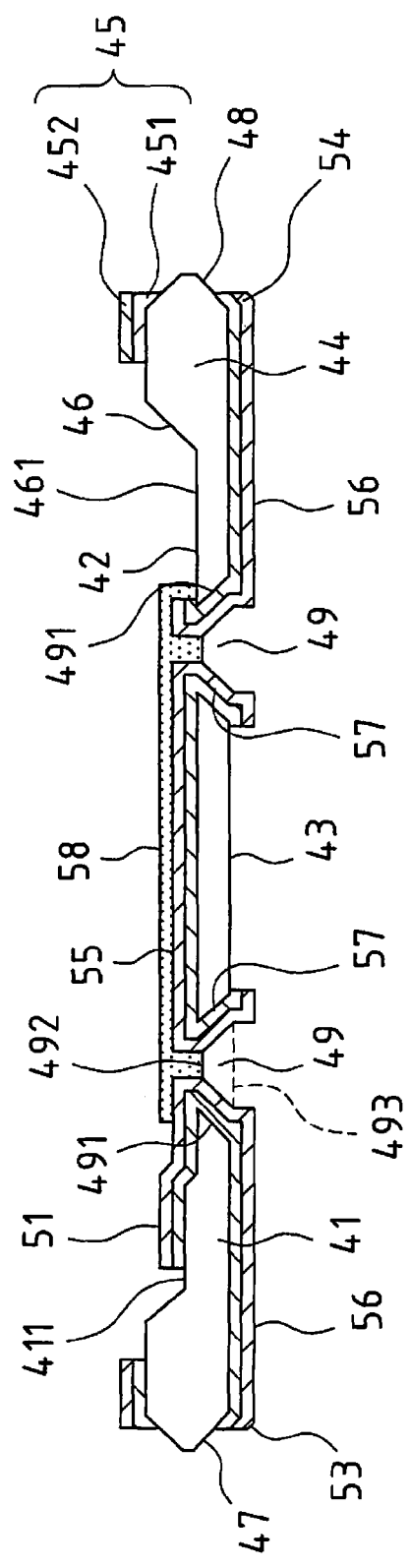
FIG. 2B is a schematic cross-sectional view of the base according to Embodiment 1, the base being cut along the dashed dotted line in FIG. 2A.
Figure 2C:
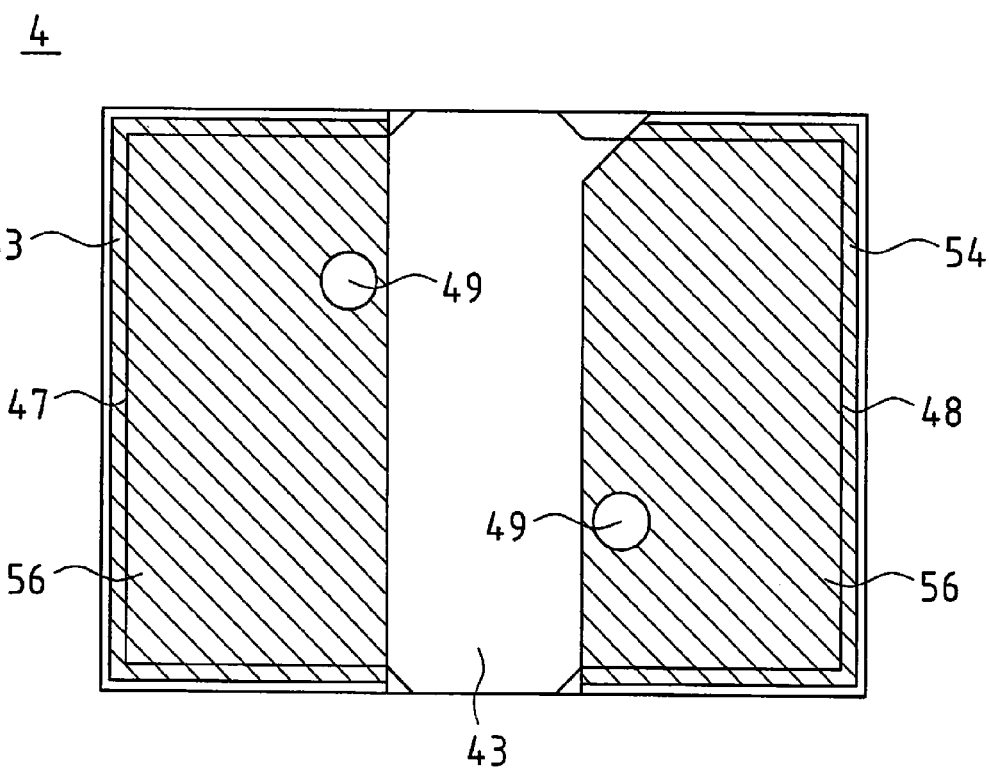
FIG. 2C is a schematic bottom view of the base according to Embodiment 1.

FIG. 1 is a schematic cross-sectional view showing an internal space of a crystal resonator according to Embodiment 1. FIGS. 2A to 2C are schematic views showing the schematic configuration of a base according to Embodiment 1, wherein FIG. 2A is a schematic plan view, FIG. 2B is a schematic cross-sectional view showing a state of a cut face obtained by cutting the base along the dashed dotted line in FIG. 2A, and FIG. 2C is a schematic bottom view.

Figure 3A:
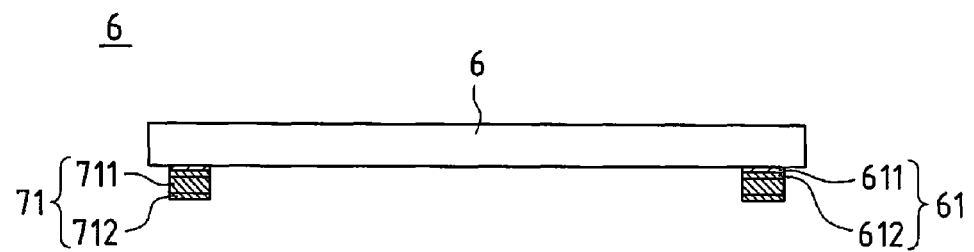
FIG. 3A is a schematic cross-sectional view of a lid according to Embodiment 1.
Figure 3B:
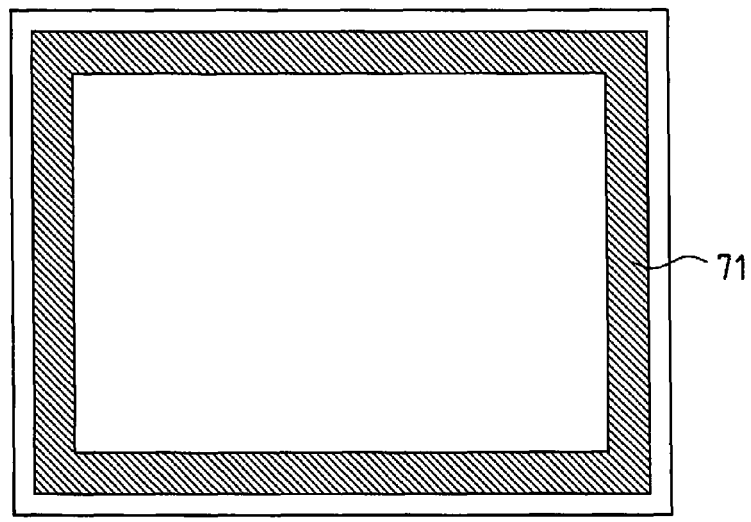
FIG. 3B is a schematic bottom view of the lid according to Embodiment 1.
Figure 4:
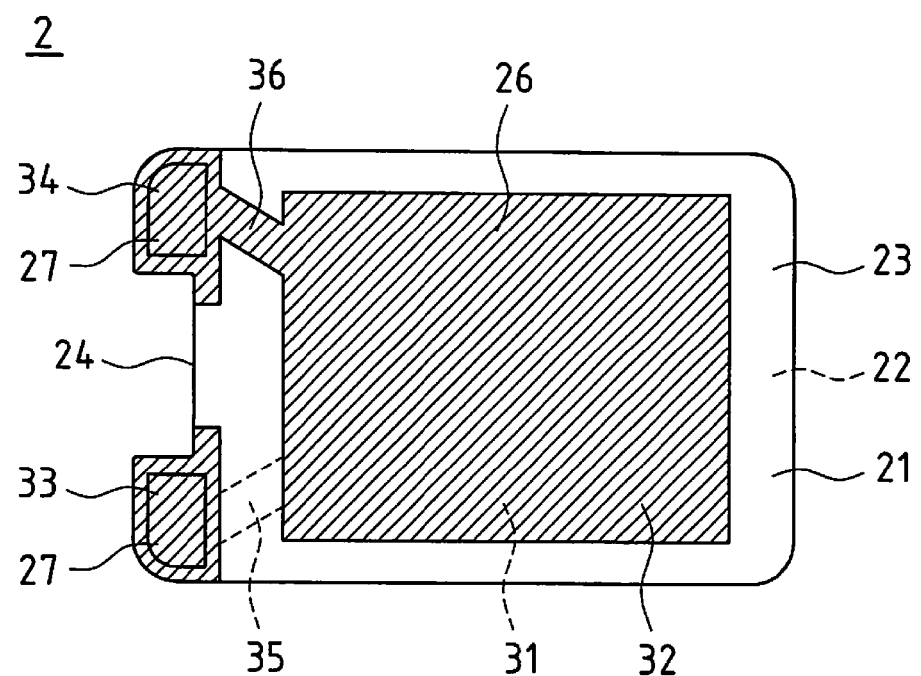
FIG. 4 is a schematic bottom view of a crystal resonator plate according to Embodiment 1.

FIGS. 3A and 3B are schematic views showing the schematic configuration of a lid according to Embodiment 1, wherein FIG. 3A is a schematic cross-sectional view, and FIG. 3B is a schematic bottom view. FIG. 4 is a schematic bottom view of a crystal resonator plate according to Embodiment 1.

As shown in FIG. 1, a crystal resonator 1 according to Embodiment 1 includes a crystal resonator plate 2 (an electronic component element in the present invention) that is made of AT-cut crystal, a base 4 (an electronic component package sealing member as a first sealing member in the present invention) that holds the crystal resonator plate 2 and is used for hermetically sealing the crystal resonator plate 2, and a lid 6 (a second sealing member in the present invention) that is disposed so as to oppose the base 4 and is used for hermetically sealing driving electrodes 31 and 32 (electrodes of an electronic component element in the present invention) of the crystal resonator plate 2 held by the base 4.

In the crystal resonator 1, a package (an electronic component package in the present invention) is configured from the base 4 and the lid 6, the base 4 and the lid 6 are bonded to each other by a bonding material 71 made of AuSn alloy, and, thus, a hermetically sealed internal space 11 is formed. In the internal space 11, the crystal resonator plate 2 is electromechanically bonded by means of ultrasonic waves to the base 4 by FCB (flip chip bonding) using a conductive bump (not shown) such as a gold bump. Here, the base 4 and the crystal resonator plate 2 may be bonded to each other via a conductive resin bonding material.

Next, constituent components of the crystal resonator 1 will be described.

The base 4 is made of glass material such as borosilicate glass, and, as shown in FIGS. 1 and 2A to 2C, is formed in the shape of a box configured from a bottom portion 41 and a wall portion 44 extending upward from the bottom portion 41 along the outer periphery of one main face (hereinafter, referred to as a "first main face") 42 of the base 4. The base 4 is formed by etching a single plate in the shape of a rectangular solid by photolithography.

The top face of the wall portion 44 of the base 4 is a bonding face to the lid 6, and this bonding face includes a first bonding layer 45 that is to be bonded to the lid 6. As shown in FIG. 2B, the first bonding layer 45 has a layered structure consisting of a plurality of layers in which a plated film 452 is formed on a sputtered film 451. The sputtered film 451 is formed by forming an Au film made of Au by sputtering, on an Mo film made of Mo formed by sputtering. The plated film 452 is formed by plating an Au film made of Au on the sputtered film 451.

A cavity 46 surrounded by the bottom portion 41 and the wall portion 44 is formed in the base 4, and, as shown in FIG. 1, the cavity 46 is formed in the shape of a rectangle when viewed from above, and the wall face of the cavity 46 is tapered. Here, in Embodiment 1, the cavity 46 is formed in the shape of a rectangle when viewed from above.

Furthermore, on a bottom face 461 of the cavity 46, two pedestal portions 411 and 412 are arranged so as to oppose each other in the lateral direction of the cavity 46. The pedestal portions 411 and 412 are each in contact with a side L1 that is along the lateral direction of the bottom face 461 of the cavity 46, and respectively in contact with sides L3 and L2 that are adjacent to the side L1 along the lateral direction and are along the longitudinal direction of the bottom face 461.

Furthermore, two castellations 47 and 48 are formed (see FIGS. 1, 2B, and 2C) on a casing back face (the other main face (hereinafter, referred to as a "second main face") 43) of the base 4 in the shape of a rectangle when viewed from above. The castellation 47 is formed on a casing side face, and is formed along the entirety of one side that is along the lateral direction of the second main face 43, and along part of two sides that are adjacent to the one side and are along the longitudinal direction of the second main face 43. The castellation 48 is formed on a casing side face, and is formed along the entirety of the other side that is along the lateral direction of the second main face 43, and along part of two sides that are adjacent to the other side and are along part of two sides along the longitudinal direction of the second main face 43. Here, in Embodiment 1, the two castellations 47 and 48 are formed such that their wall faces are inclined with respect to the second main face 43 of the base 4.

Furthermore, in the base 4, as shown in FIGS. 1 and 2A to 2C, through holes 49 that pass through the substrate of the base 4 are formed. Inner side faces 491 of the through holes 49 are tapered so as to be inclined with respect to the first main face 42 and the second main face 43 of the base 4. The through holes 49 have a diameter that is largest at an end portion on the second main face 43 side of the base 4 and is smallest at an end portion on the first main face 42 side of the base 4.

Furthermore, on the substrate of the base 4, formed are a pair of electrode pads 51 and 52 that are electromechanically bonded respectively to the driving electrodes 31 and 32 of the crystal resonator plate 2, external terminal electrodes 53 and 54 that are electrically connected to external components and external devices, and wiring patterns (not shown) that electrically connect the electrode pad 51 and the external terminal electrode 53, and the electrode pad 52 and the external terminal electrode 54. The electrode pads 51 and 52, the external terminal electrodes 53 and 54, and the wiring patterns constitute electrodes 55, 56, and 57 of the base 4. The electrode pads 51 and 52 are formed on the surfaces of the pedestal portions 411 and 412, and the external terminal electrodes 53 and 54 are formed on the castellations 47 and 48. The wiring patterns are formed so as to extend from the electrode pads 51 and 52 of the first main face 42 of the base 4 via the inner side faces 491 of the through holes 49 to the external terminal electrodes 53 and 54 of the second main face 43.

Here, among the electrodes 55, 56, and 57 formed on the substrate of the base 4, the electrodes 55 formed on the first main face 42 (excluding open faces 492 of the through holes 49) of the substrate of the base 4 are referred to as internal electrodes (hereinafter, referred to as "the internal electrodes 55" when they have to be distinguished from the other electrodes 56 and 57), the electrodes 56 formed on the second main face 43 (excluding open faces 493 of the through holes 49) of the substrate of the base 4 are referred to as external electrodes (hereinafter, referred to as "the external electrodes 56" when they have to be distinguished from the other electrodes 55 and 57), and the electrodes 57 formed so as to extend from the inner side faces 491 of the through holes 49 to the open faces 492 and 493 of the through holes 49 are referred to as through electrodes (hereinafter, referred to as "the through electrodes 57" when they have to be distinguished from the other electrodes 55 and 56). That is to say, in Embodiment 1, the through electrodes 57 are formed on the entire inner side faces 491 of the through holes 49 and the circumferential edge portions of the open faces 492 and 493 of the through holes 49.

The internal electrodes 55 including the electrode pads 51 and 52, the external electrodes 56 including the external terminal electrodes 53 and 54, and the through electrodes 57 are made of the same material as the first bonding layer 45, and are simultaneously formed with the first bonding layer 45.

Furthermore, a resin pattern 58 (resin material) is disposed across at least half the region of the bottom face 461 of the cavity 46 corresponding to the first main face 42 of the base 4. The open faces 492 on the first main face 42 side of the base 4 are sealed with the resin pattern 58, and the surface of the part of the internal electrodes 55 other than the electrode pads 51 and 52 is coated with the resin. Here, as the resin material forming the resin pattern 58, any resin material that well adheres to the material forming the base 4 (e.g., glass material) may be used, and preferable examples thereof include resin materials such as benzocyclobutene (BCB), polybenzoxazole, epoxy, polyimide, and fluorine-based resins. Here, in Embodiment 1, the resin pattern 58 is formed on the bottom face 461 of the cavity 46 by photolithography, and a photosensitive resin material is used as the resin material forming the resin pattern 58. Here, the photosensitive resin material in the present invention corresponds to a wider concept that includes not only resin materials made of a photosensitive resin but also photosensitive resin compositions containing a photosensitizer and a resin.

The lid 6 is made of glass material such as borosilicate glass, and, as shown in FIGS. 1, 3A, and 3B, is formed as a single plate in the shape of a rectangular solid. Along the outer periphery of the lower face of the lid 6, a second bonding layer 61 is formed.

As shown in FIG. 3A, the second bonding layer 61 of the lid 6 has a layered structure consisting of a plurality of layers in which an Au film 612 made of Au is formed on an Mo film 611 made of Mo. The Mo film 611 is formed by sputtering. The Au film 612 is formed by sputtering.

Furthermore, as shown in FIGS. 3A and 3B, the bonding material 71 is layered on the second bonding layer 61 of the lid 6 before bonding to the base 4. The bonding material 71 is configured from an Au/Sn film 711 that is layered on the second bonding layer 61 and an Au film 712 that is layered on the Au/Sn film 711. Here, the Au/Sn film 711 is configured from an Au film that is plated so as to be layered on the second bonding layer 61 and an Sn film that is plated on this Au film. The Au film 712 is configured from an Au strike plated film that is plated so as to be layered on the Au/Sn film 711 and an Au plated film that is plated so as to be layered on this Au strike plated film. In such a bonding material 71, the Au/Sn film 711 is melted with application of heat to form an AuSn alloy film. Here, the bonding material 71 may be formed by plating an AuSn alloy on the second bonding layer 61 of the lid 6.

The crystal resonator plate 2 is configured from a base plate 21 made of an AT-cut crystal piece, and its external shape is, as shown in FIGS. 1 and 4, a single plate in the shape of a rectangular solid in which two main faces 22 and 23 are substantially rectangular.

The crystal resonator plate 2 includes a vibrating portion 26 that constitutes a vibrating region and bonding portions 27 that are bonded to the electrode pads 51 and 52 of the base 4, and the vibrating portion 26 and the bonding portions 27 are integrally shaped to form the base plate 21. Furthermore, in the bonding portions 27, a center portion 24 of a shorter side when viewed from above of the base plate 21 is formed as a cut-out portion.

On the crystal resonator plate 2, formed are the pair of driving electrodes 31 and 32 that perform excitation, a pair of terminal electrodes 33 and 34 that are electromechanically bonded to the electrode pads 51 and 52 of the base 4, and extension electrodes 35 and 36 that extend the pair of driving electrodes 31 and 32 to the pair of terminal electrodes 33 and 34. The pair of driving electrodes 31 and 32 are extended by the extension electrodes 35 and 36 and electrically connected respectively to the pair of terminal electrodes 33 and 34.

The pair of driving electrodes 31 and 32 are the two main faces 22 and 23 of the base plate 21, and are formed so as to oppose each other at the center of the vibrating portion 26 when viewed from above. The pair of driving electrodes 31 and 32 include, for example, a Cr—Au film formed by layering Cr and Au in this order from the base plate 21 side.

The pair of terminal electrodes 33 and 34 are formed on the other main face 23 at the bonding portions 27. One terminal electrode 33 of the pair of terminal electrodes 33 and 34 is formed at one side along the longitudinal direction of the base plate 21 and the vicinity thereof, and the other terminal electrode 34 is formed at the other side along the longitudinal direction of the base plate 21 and the vicinity thereof. The pair of terminal electrodes 33 and 34 include, for example, a Cr—Au film formed by layering Cr and Au in this order from the base plate 21 side, as in the driving electrodes 31 and 32. Furthermore, as shown in FIG. 4, the pair of terminal electrodes 33 and 34 have a two-layer structure consisting of an upper layer and a lower layer. The upper layer is made of Au, and the lower layer is made of Cr—Au. The area of a main face (a face when viewed from above) of the lower layer is larger than the area of a main face (a face when viewed from above) of the upper layer.

The extension electrodes 35 and 36 are formed at the vibrating portion 26 and the bonding portions 27, and formed so as not to oppose each other from the vibrating portion 26 to the bonding portions 27 on the two main faces 22 and 23 of the base plate 21. The extension electrodes 35 and 36 include, for example, a Cr—Au film formed by layering Cr and Au in this order from the base plate 21 side, as in the driving electrodes 31 and 32.

In the thus configured crystal resonator 1, as shown in FIG. 1, the base 4 and the crystal resonator plate 2 are electromechanically bonded by means of ultrasonic waves by FCB via conductive bumps (not shown). With this bonding, the driving electrodes 31 and 32 of the crystal resonator plate 2 are electromechanically bonded via the extension electrodes 35 and 36, the terminal electrodes 33 and 34, and the conductive bumps to the electrode pads 51 and 52 of the base 4, and the crystal resonator plate 2 is mounted on the base 4. Then, the lid 6 is temporarily bonded by FCB to the base 4 on which the crystal resonator plate 2 has been mounted. Subsequently, the bonding material 71, the first bonding layer 45, and the second bonding layer 61 are melted with application of heat in a nitrogen atmosphere, and, thus, the second bonding layer 61 of the lid 6 is bonded via the bonding material 71 to the first bonding layer 45 of the base 4, and the crystal resonator 1 in which the crystal resonator plate 2 is hermetically sealed is manufactured. As the conductive bumps, plated bumps made of non-flowable material are used.

Next, a method for manufacturing the crystal resonator 1 and the base 4 will be described with reference to FIGS. 5A to 23B. Here, in FIGS. 5A to 23B, drawings whose reference numerals have A (hereinafter, referred to as an "A-drawing") are schematic plan views of part of a wafer in one step of the process for manufacturing the base 4, and drawings whose reference numerals have B are schematic cross-sectional views showing a state of a cut face obtained by cutting the wafer shown in the A-drawings along the dashed dotted line in the A-drawings.

Figure 5A:
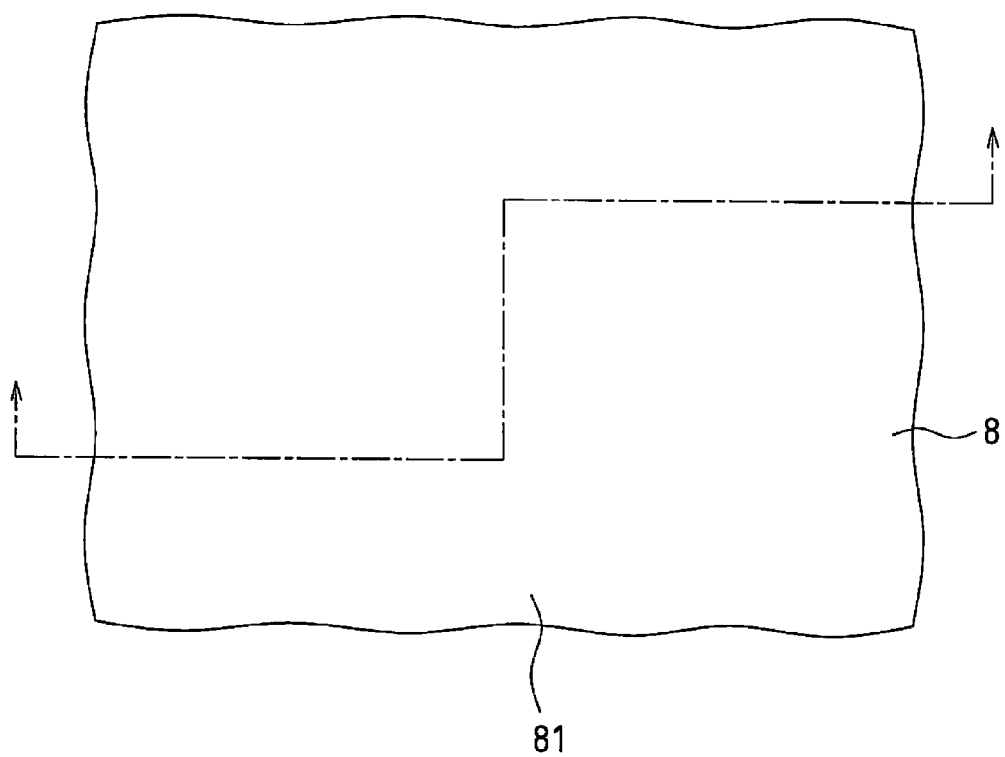
FIG. 5A is a schematic plan view of part of a wafer showing one step of the process for manufacturing the base according to Embodiment 1.
Figure 5B:
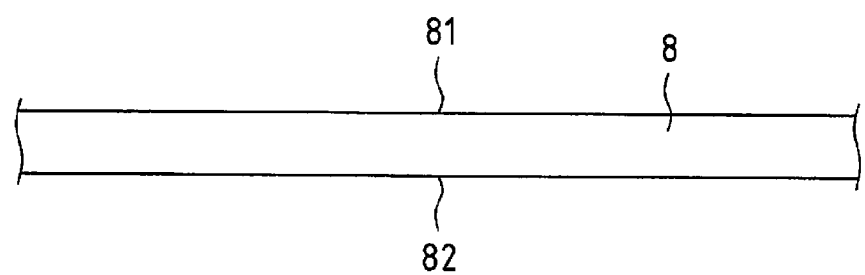
FIG. 5B is a schematic cross-sectional view in which the wafer shown in FIG. 5A has been cut along the dashed dotted line in FIG. 5A.

First, two main faces of a wafer 8 made of glass material in which a large number of bases 4 are to be formed are washed (see FIGS. 5A and 5B).

Figure 6A:
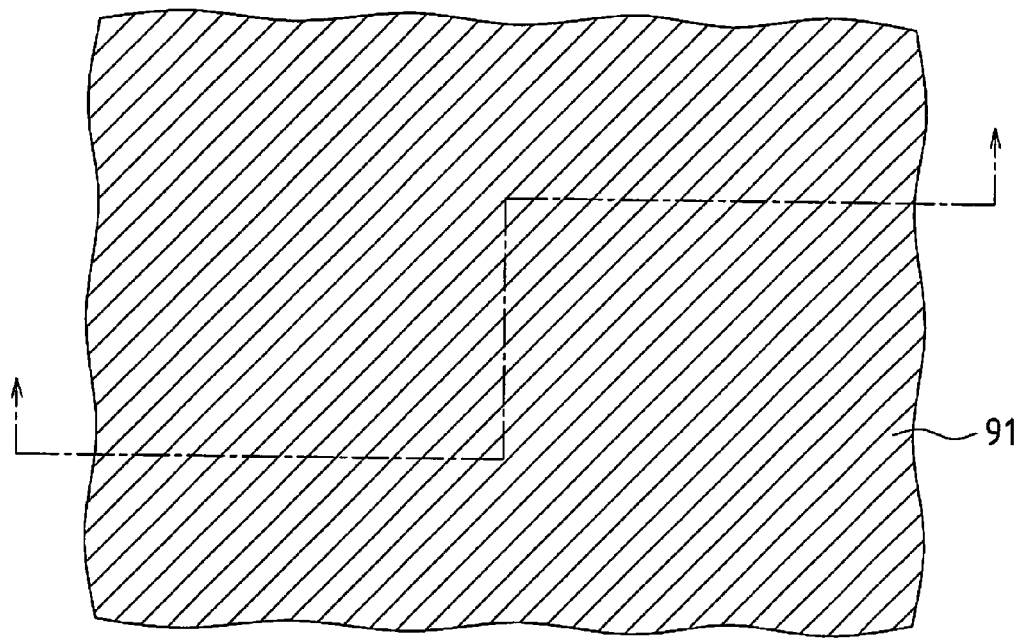
FIG. 6A is a schematic plan view of part of the wafer showing one step of the process for manufacturing the base according to Embodiment 1.
Figure 6B:
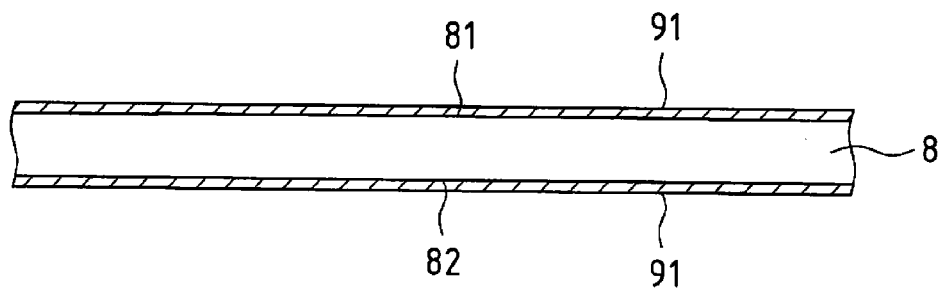
FIG. 6B is a schematic cross-sectional view in which the wafer shown in FIG. 6A has been cut along the dashed dotted line in FIG. 6A.

After the washing of the wafer 8 has completed, as shown in FIGS. 6A and 6B, protective layers 91 are formed on two main faces 81 and 82 of the wafer. More specifically, Mo layers made of Mo are formed on the two main faces 81 and 82 of the wafer 8 by sputtering, and, then, Au layers are formed on the Mo layers by sputtering to form protective layers 91 each including an Mo layer and an Au layer.

Figure 7A:
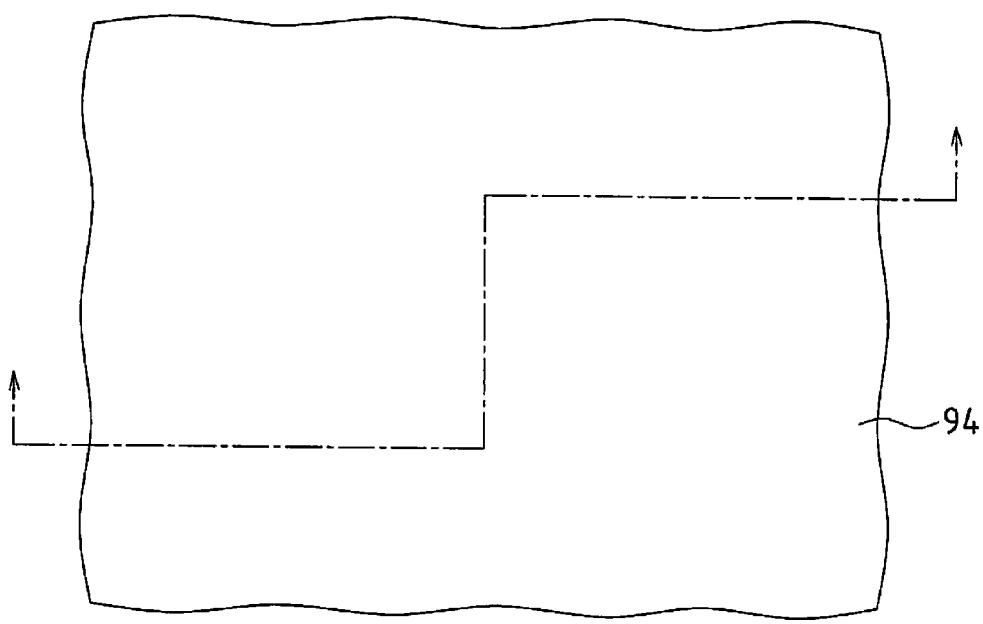
FIG. 7A is a schematic plan view of part of the wafer showing one step of the process for manufacturing the base according to Embodiment 1.
Figure 7B:
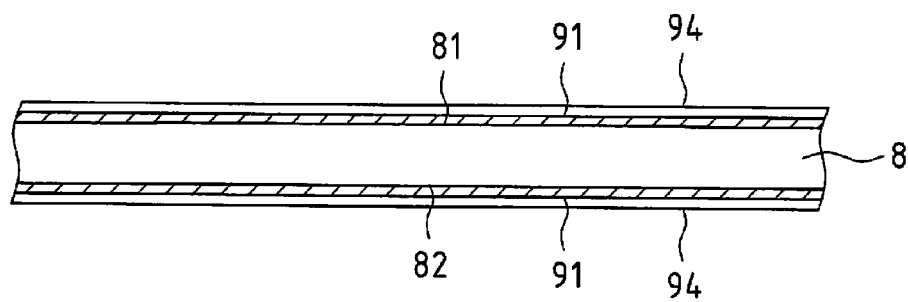
FIG. 7B is a schematic cross-sectional view in which the wafer shown in FIG. 7A has been cut along the dashed dotted line in FIG. 7A.

After the protective layers 91 have been formed on the two main faces 81 and 82 of the wafer 8, as shown in FIGS. 7A and 7B, resists are applied to the protective layers 91 by spin coating to form positive resist layers 94.

Then, after the positive resist layers 94 have been formed on the protective layers 91, the positive resist layers 94 are exposed to light and developed at the positions where the contour of the base 4, the bottom face (excluding portions where the pedestal portions 411 and 412 are to be formed) of the cavity 46, and the through holes 49 shown in FIGS. 2A to 2C are to be formed. Subsequently, the protective layers 91 are etched at the positions exposed through the light exposure and the development where the contour of the base 4, the bottom face (excluding portions where the pedestal portions 411 and 412 are to be formed) of the cavity 46, and the through holes 49 are to be formed.

After the protective layers 91 have been etched at the positions where the contour of the base 4, the bottom face (excluding portions where the pedestal portions 411 and 412 are to be formed) of the cavity 46, and the through holes 49 are to be formed, resists are applied to the wafer 8 by spin coating to form new positive resist layers 94.

Figure 8A:
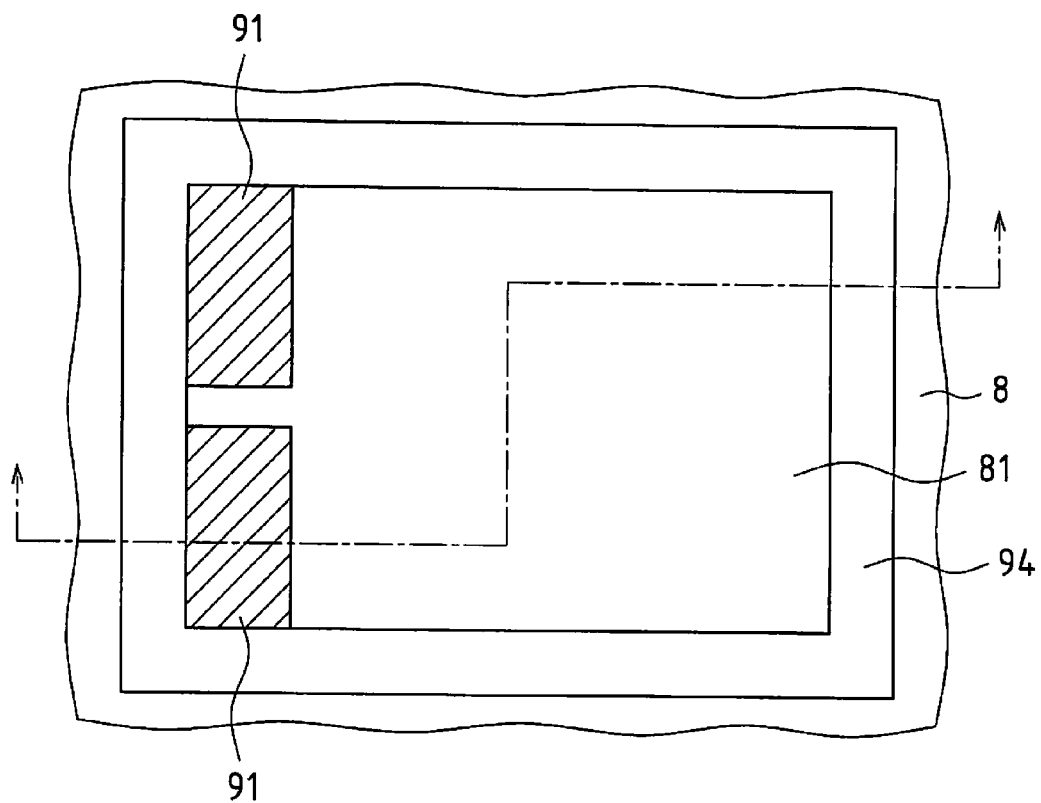
FIG. 8A is a schematic plan view of part of the wafer showing one step of the process for manufacturing the base according to Embodiment 1.
Figure 8B:
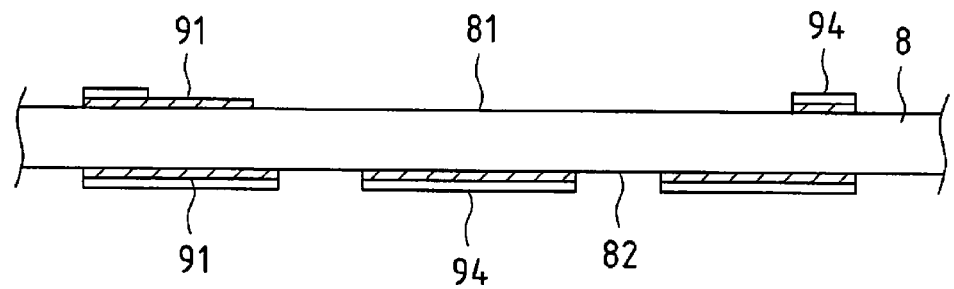
FIG. 8B is a schematic cross-sectional view in which the wafer shown in FIG. 8A has been cut along the dashed dotted line in FIG. 8A.

After the new positive resist layers 94 have been formed, the positive resist layers 94 are exposed to light and developed at the positions where the contour of the base 4, the bottom face (including portions where the pedestal portions 411 and 412 are to be formed) of the cavity 46, and the through holes 49 are to be formed, and, thus, as shown in FIGS. 8A and 8B, the wafer 8 is exposed at the positions where the contour of the base, the bottom face (excluding portions where the pedestal portions 411 and 412 are to be formed) of the cavity 46, and the through holes 49 are to be formed, and the protective layers 91 are exposed at the positions where the pedestal portions 411 and 412 are to be formed.

Figure 9A:
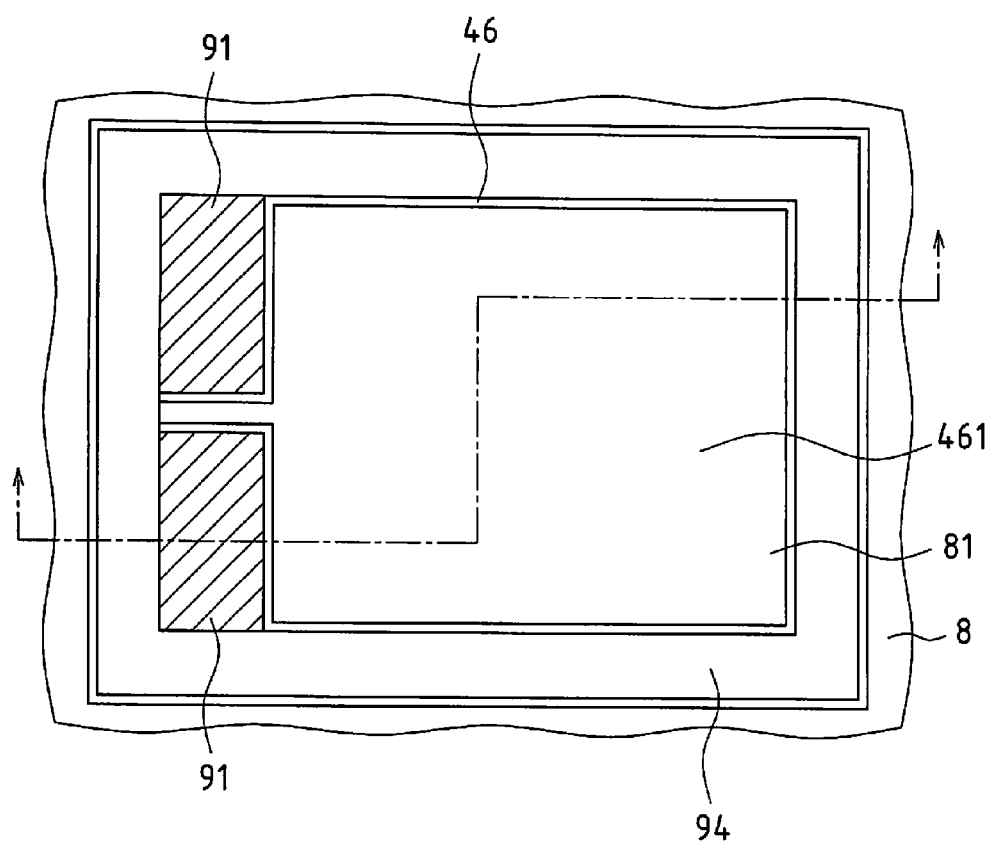
FIG. 9A is a schematic plan view of part of the wafer showing one step of the process for manufacturing the base according to Embodiment 1.
Figure 9B:
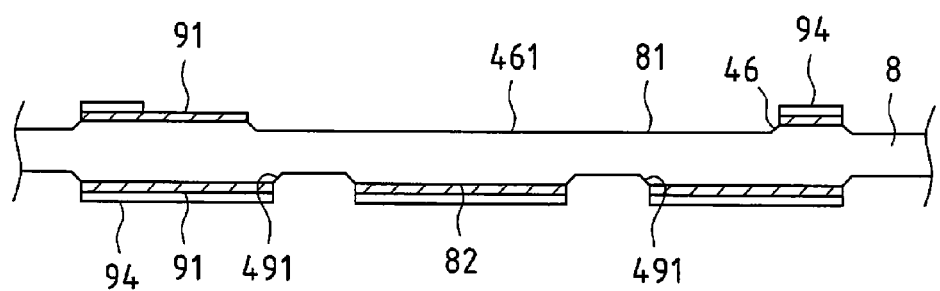
FIG. 9B is a schematic cross-sectional view in which the wafer shown in FIG. 9A has been cut along the dashed dotted line in FIG. 9A.

Subsequently, as shown in FIGS. 9A and 9B, part of the contour of the base 4, part of the cavity 46, and part of the through holes 49 (part of the inner side faces 491) are formed by wet etching with an etching solution using the protective layers 91 and the positive resist layers 94 as masks.

Figure 10A:
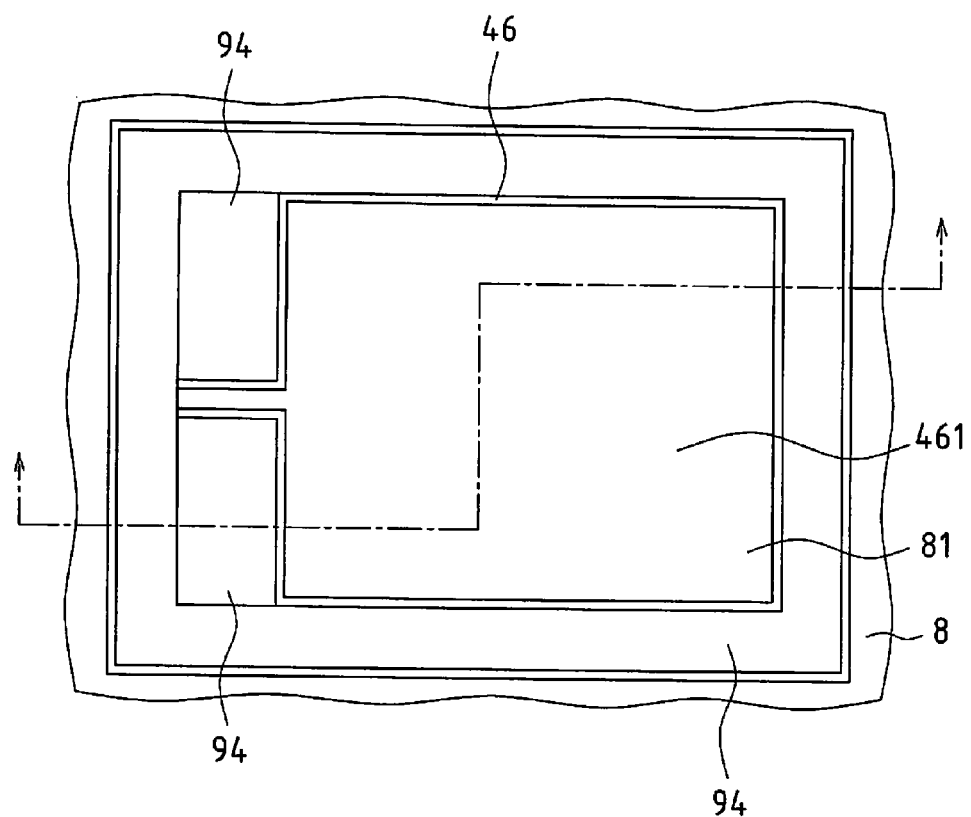
FIG. 10A is a schematic plan view of part of the wafer showing one step of the process for manufacturing the base according to Embodiment 1.
Figure 10B:
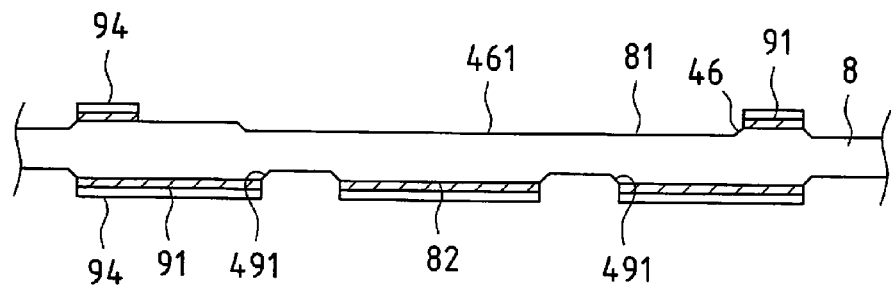
FIG. 10B is a schematic cross-sectional view in which the wafer shown in FIG. 10A has been cut along the dashed dotted line in FIG. 10A.

After the etching of the wafer 8 has completed, as shown in FIGS. 10A and 10B, metal etching is performed on the protective layers 91 positioned (exposed) at the positions where the pedestal portions 411 and 412 are to be formed.

Figure 11A:
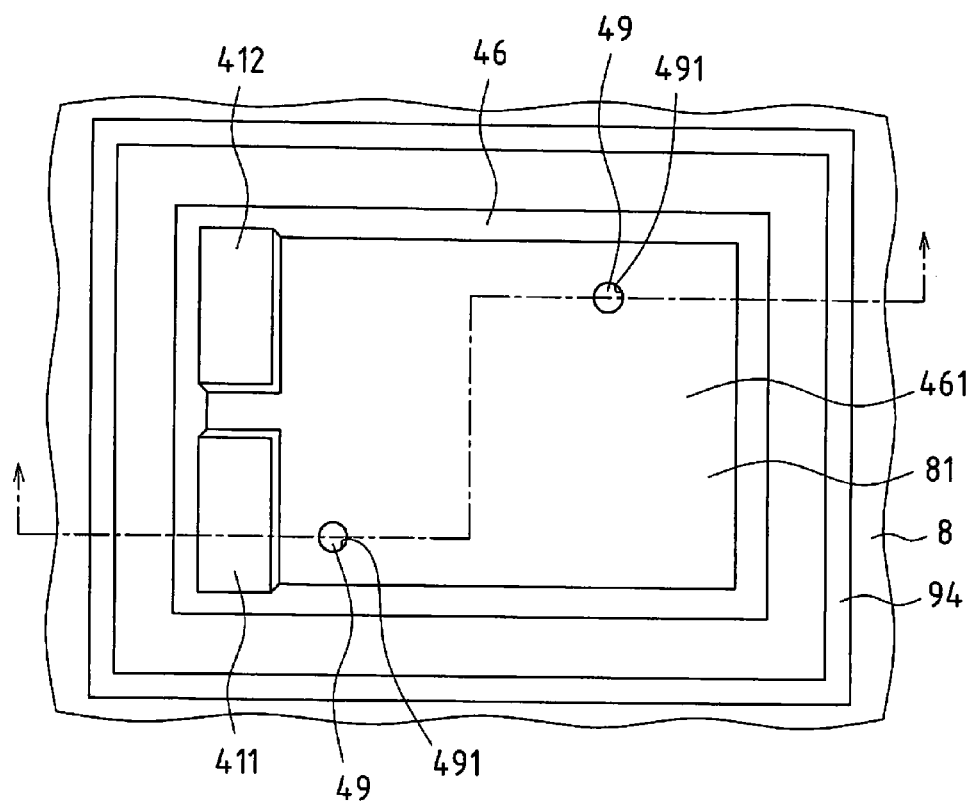
FIG. 11A is a schematic plan view of part of the wafer showing one step of the process for manufacturing the base according to Embodiment 1.
Figure 11B:
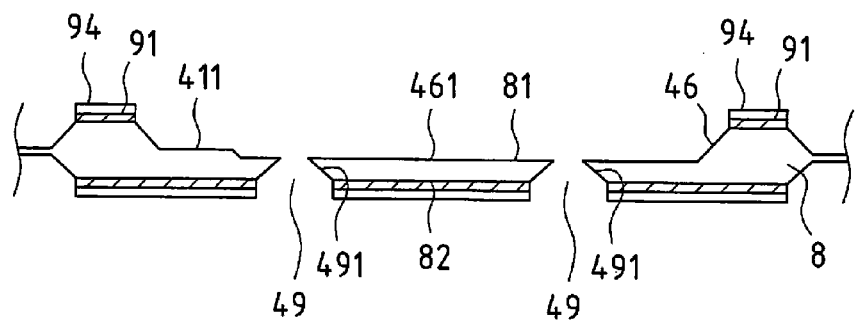
FIG. 11B is a schematic cross-sectional view in which the wafer shown in FIG. 11A has been cut along the dashed dotted line in FIG. 11A.

After the protective layers 91 have been metal-etched at the positions where the pedestal portions 411 and 412 are to be formed, as shown in FIGS. 11A and 11B, the entire contour of the base 4, the entire cavity 46 (including the pedestal portions 411 and 412), the entire through holes 49 (the entire inner side faces 491) are formed by wet etching with an etching solution using the protective layers 91 and the positive resist layers 94 as masks.

Figure 12A:
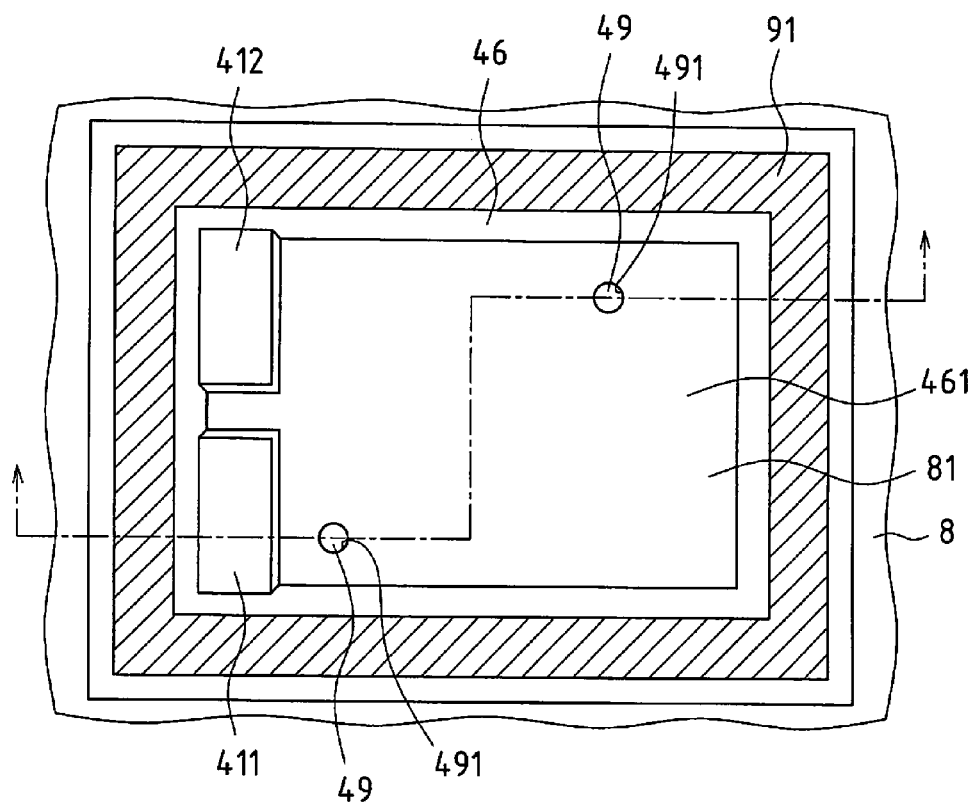
FIG. 12A is a schematic plan view of part of the wafer showing one step of the process for manufacturing the base according to Embodiment 1.
Figure 12B:
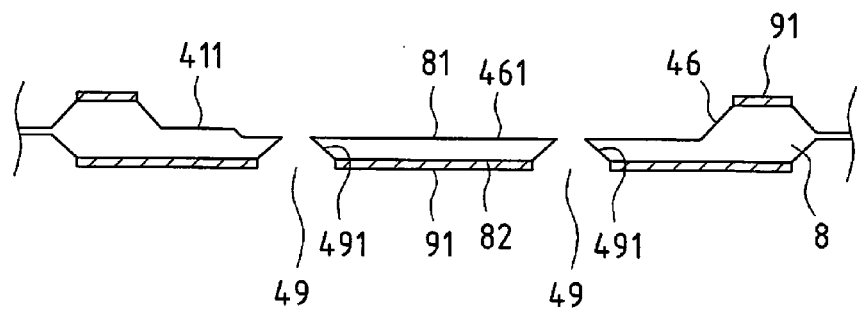
FIG. 12B is a schematic cross-sectional view in which the wafer shown in FIG. 12A has been cut along the dashed dotted line in FIG. 12A.

After the etching of the wafer 8 has completed, as shown in FIGS. 12A and 12B, the positive resist layers 94 are peeled and removed.

Figure 13A:
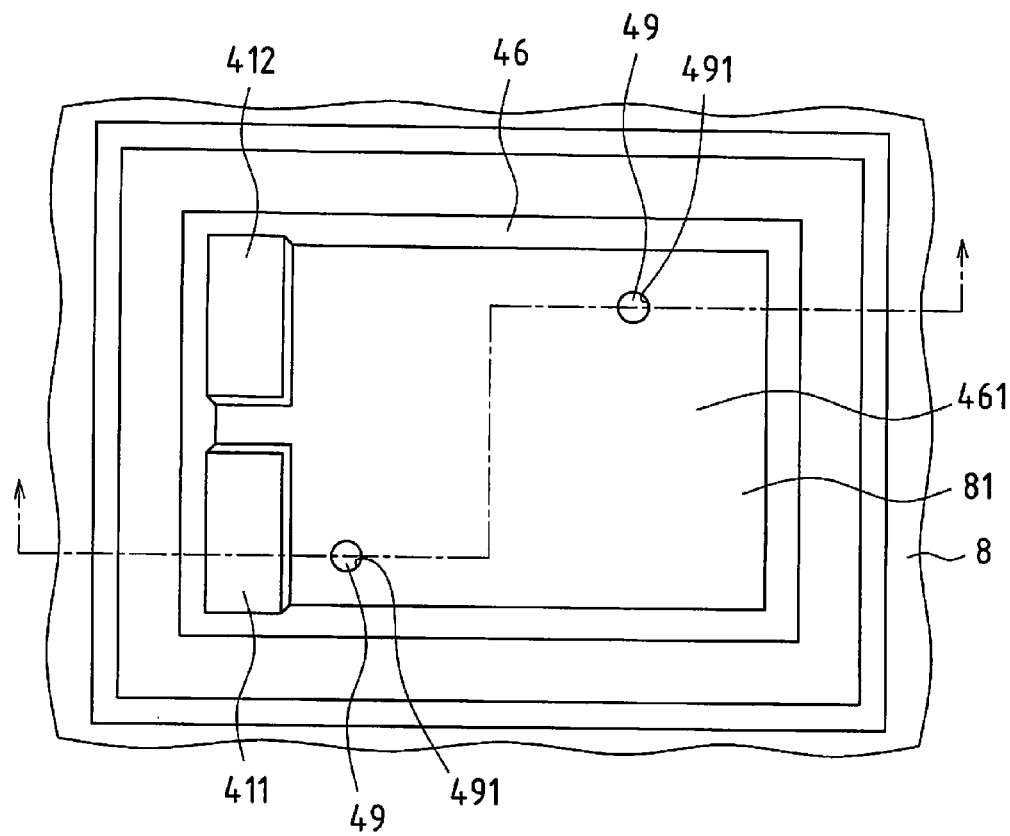
FIG. 13A is a schematic plan view of part of the wafer showing one step of the process for manufacturing the base according to Embodiment 1.
Figure 13B:
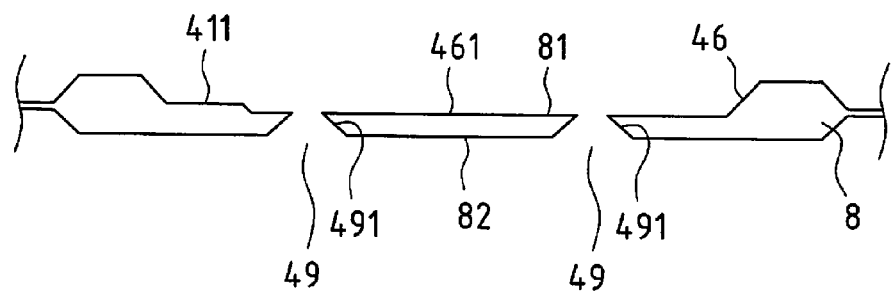
FIG. 13B is a schematic cross-sectional view in which the wafer shown in FIG. 13A has been cut along the dashed dotted line in FIG. 13A.

After the positive resist layers 94 have been peeled and removed, as shown in FIGS. 13A and 13B, the exposed protective layers 91 are metal-etched and removed, and the entire two main faces 81 and 82 of the wafer 8 are exposed.

Figure 14A:
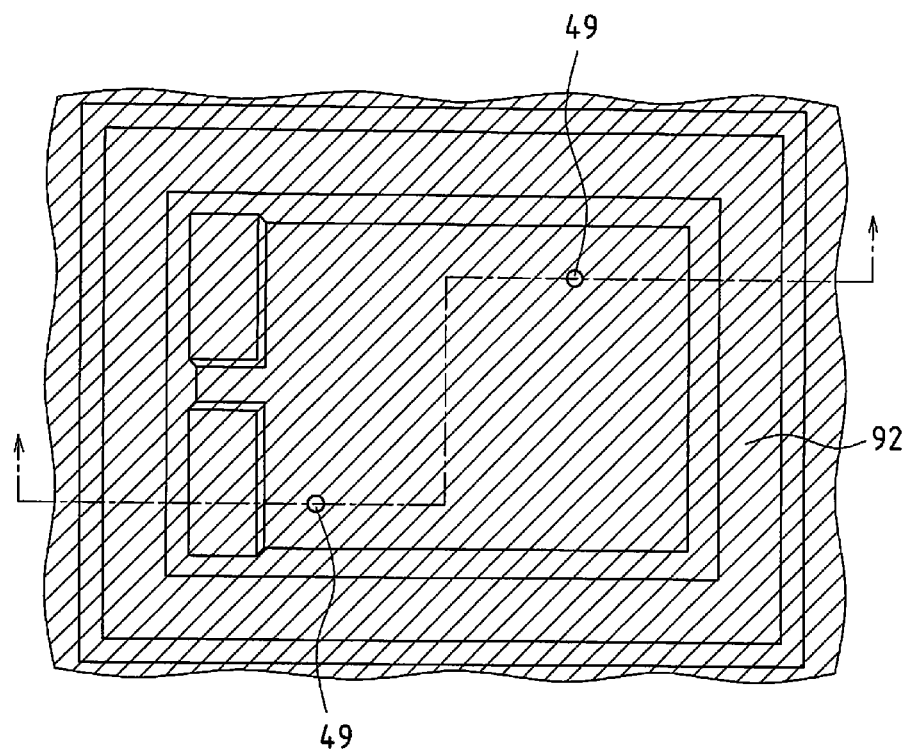
FIG. 14A is a schematic plan view of part of the wafer showing one step of the process for manufacturing the base according to Embodiment 1.
Figure 14B:
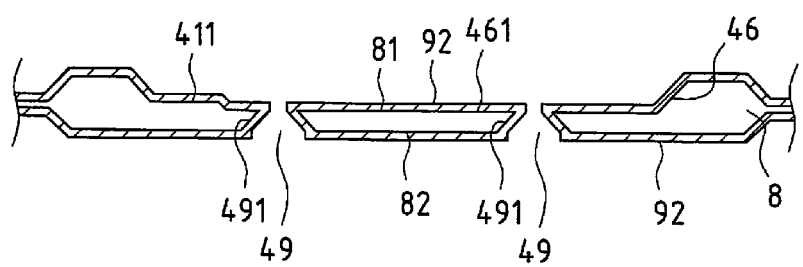
FIG. 14B is a schematic cross-sectional view in which the wafer shown in FIG. 14A has been cut along the dashed dotted line in FIG. 14A.

After the protective layers 91 have been metal-etched, as shown in FIGS. 14A and 14B, metal layers 92 are formed on the wafer 8 (the two main faces 81 and 82 and the inner side faces 491 of the through holes 49). More specifically, Mo layers made of Mo are formed on the wafer 8 (the two main faces 81 and 82 and the inner side faces 491 of the through holes 49) by sputtering, and, then, Au layers made of Au are formed on the Mo layers by sputtering to form metal layers 92 each including an Mo layer and an Au layer. The thus formed metal layers 92 function as the sputtered film 451 constituting the first bonding layer 45 (see FIG. 2B).

After the metal layers 92 have been formed on the two main faces 81 and 82 of the wafer 8, resists are applied to the metal layers 92 by dip coating to form new positive resist layers 94.

Figure 15A:
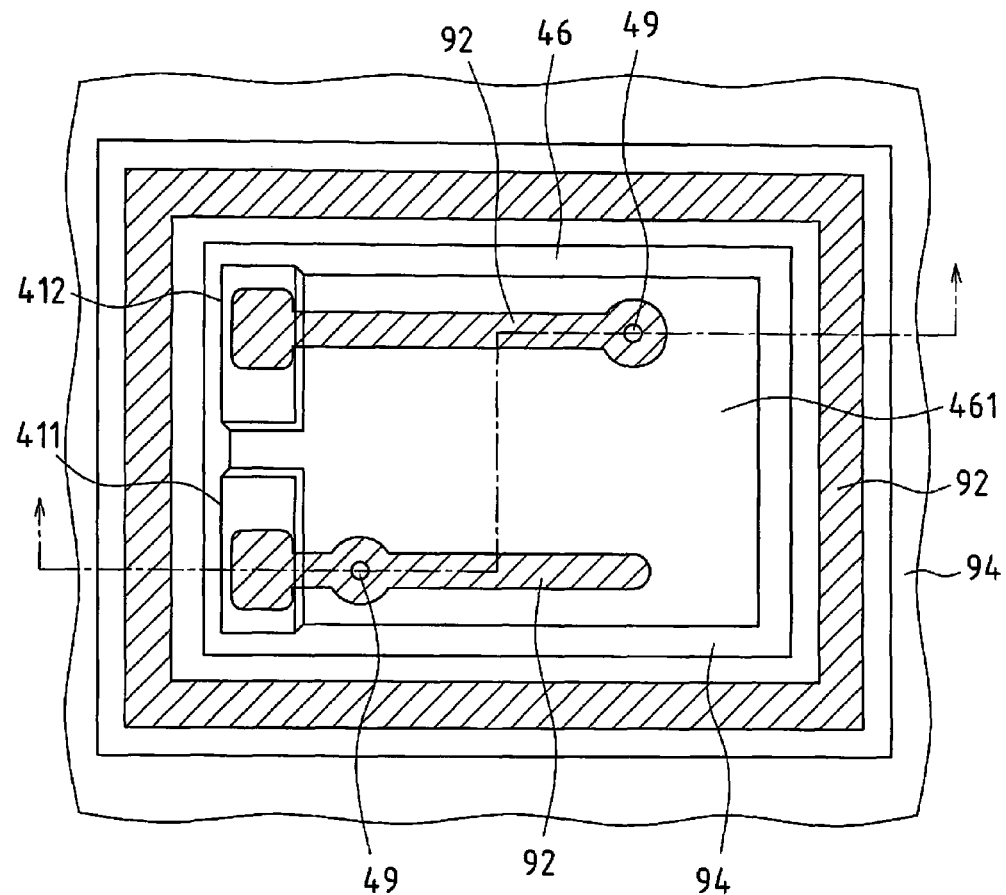
FIG. 15A is a schematic plan view of part of the wafer showing one step of the process for manufacturing the base according to Embodiment 1.
Figure 15B:
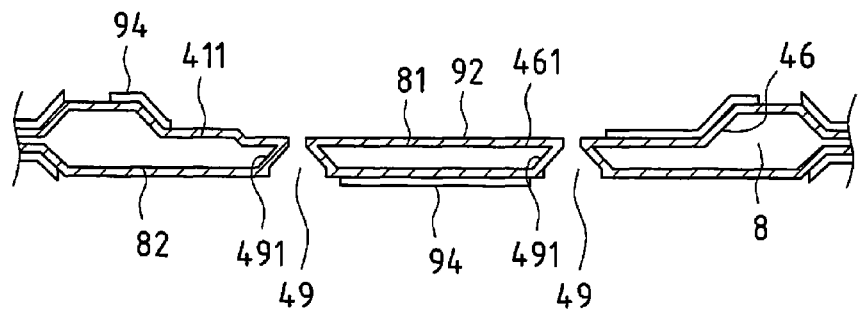
FIG. 15B is a schematic cross-sectional view in which the wafer shown in FIG. 15A has been cut along the dashed dotted line in FIG. 15A.

After the positive resist layers 94 have been formed on the metal layers 92, the positive resist layers 94 are exposed to light and developed at the positions where the first bonding layer 45 of the base 4, the electrode pads 51 and 52, the external terminal electrodes 53 and 54, and the wiring patterns are to be formed, and, thus, as shown in FIGS. 15A and 15B, the metal layers 92 are exposed at the positions where the first bonding layer 45, the electrode pads 51 and 52, the external terminal electrodes 53 and 54, and the wiring patterns are to be formed.

Figure 16A:
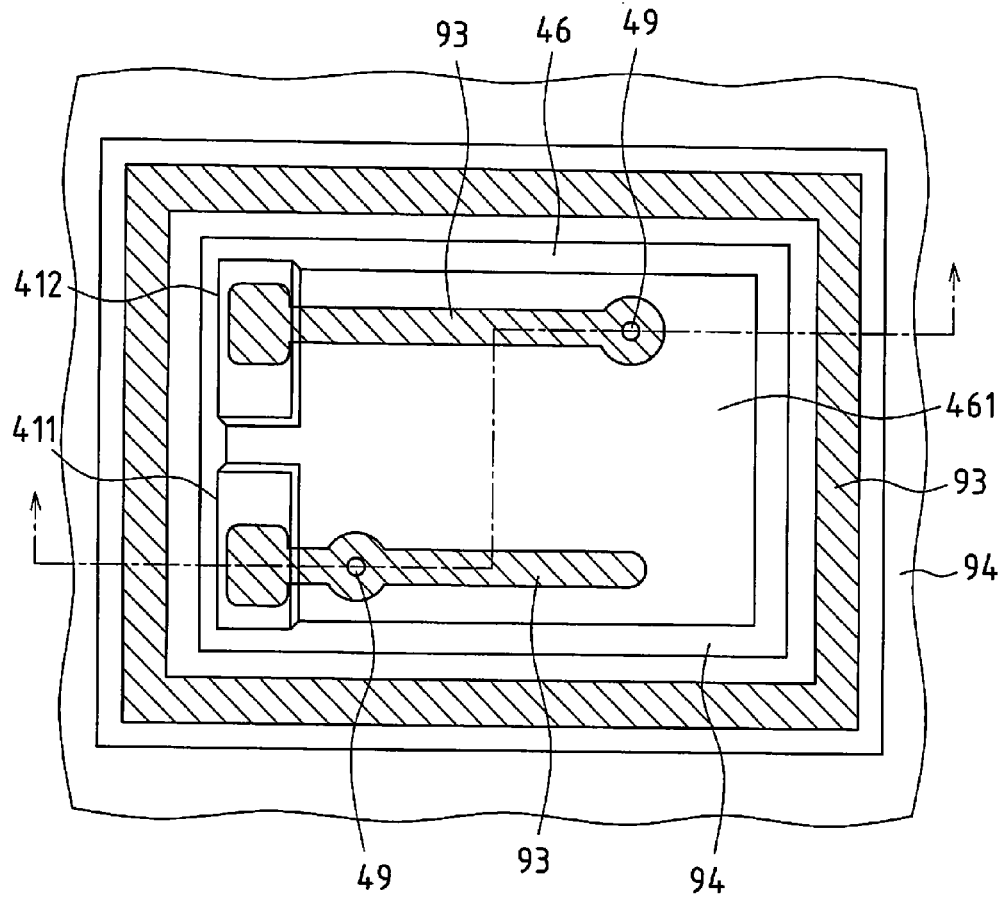
FIG. 16A is a schematic plan view of part of the wafer showing one step of the process for manufacturing the base according to Embodiment 1.
Figure 16B:
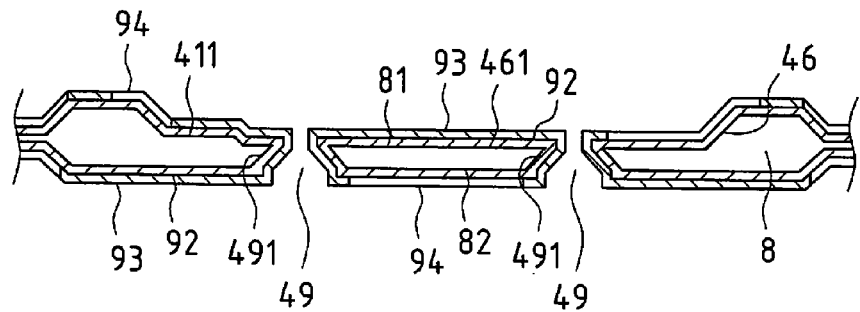
FIG. 16B is a schematic cross-sectional view in which the wafer shown in FIG. 16A has been cut along the dashed dotted line in FIG. 16A.

On the metal layers 92 exposed through the light exposure and the development, Au is plated to form plated layers 93 as shown in FIGS. 16A and 16B, and, thus, outer layer films of the first bonding layer 45, the electrode pads 51 and 52, the external terminal electrodes 53 and 54, and the wiring patterns are formed. Here, the thus formed plated layers 93 function as the plated film 452 of the first bonding layer 45 (see FIG. 2B).

Figure 17A:
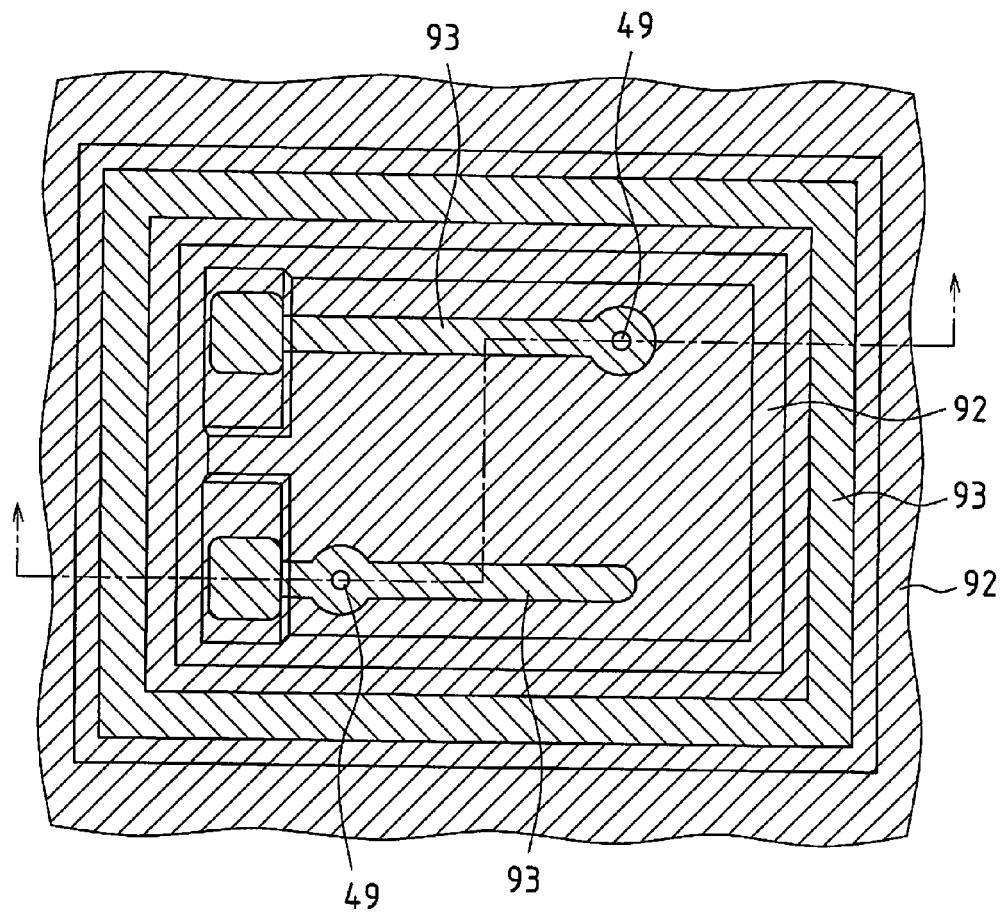
FIG. 17A is a schematic plan view of part of the wafer showing one step of the process for manufacturing the base according to Embodiment 1.
Figure 17B:
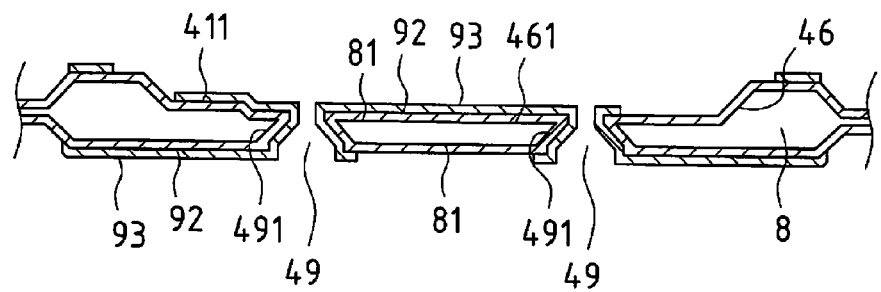
FIG. 17B is a schematic cross-sectional view in which the wafer shown in FIG. 17A has been cut along the dashed dotted line in FIG. 17A.

After the first bonding layer 45, the electrode pads 51 and 52, the external terminal electrodes 53 and 54, and the wiring patterns have been formed, as shown in FIGS. 17A and 17B, the positive resist layers 94 are peeled and removed.

Figure 18A:
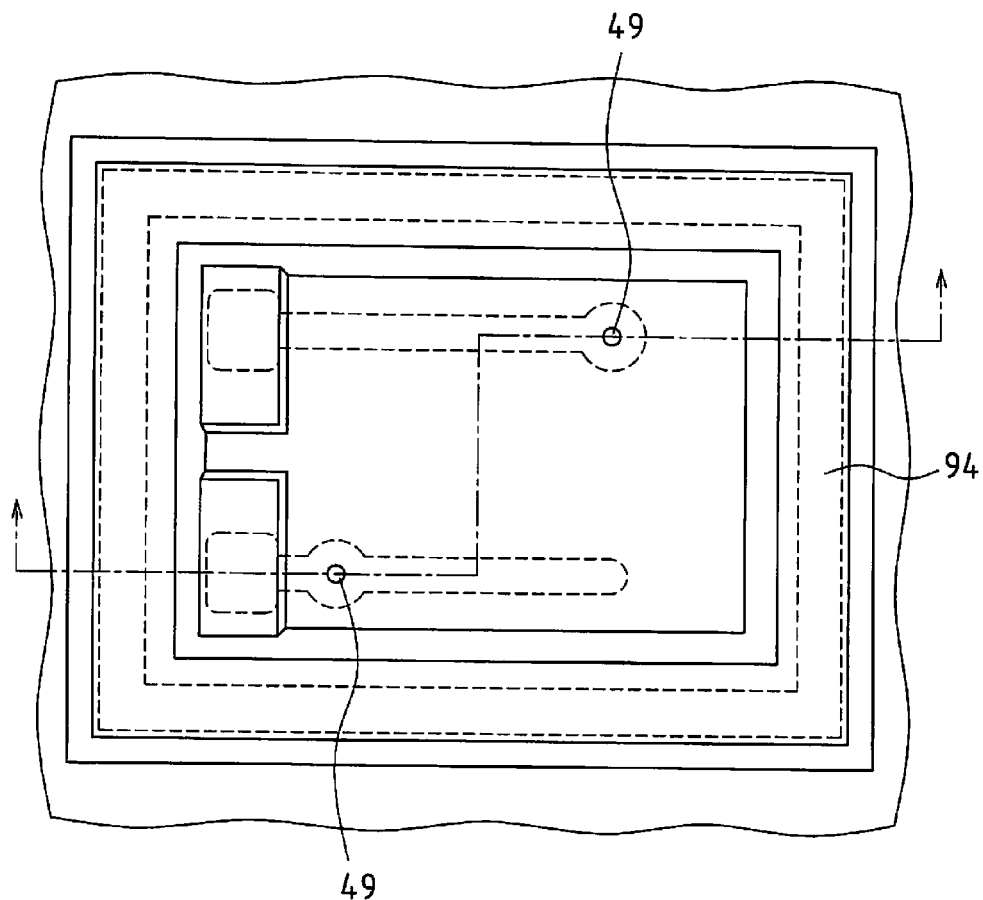
FIG. 18A is a schematic plan view of part of the wafer showing one step of the process for manufacturing the base according to Embodiment 1.
Figure 18B:
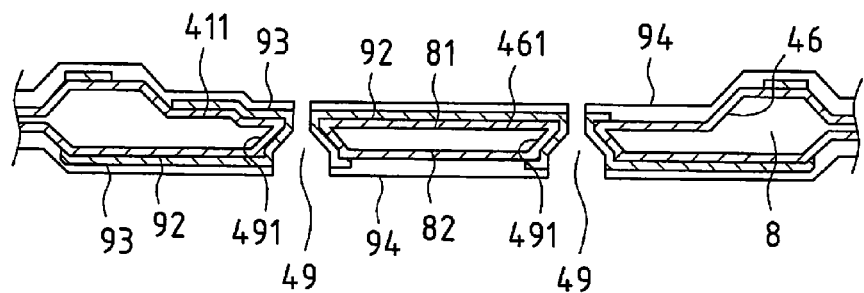
FIG. 18B is a schematic cross-sectional view in which the wafer shown in FIG. 18A has been cut along the dashed dotted line in FIG. 18A.

Subsequently, as shown in FIGS. 18A and 18B, resists are applied to the wafer 8 by dip coating to form new positive resist layers 94.

Figure 19A:
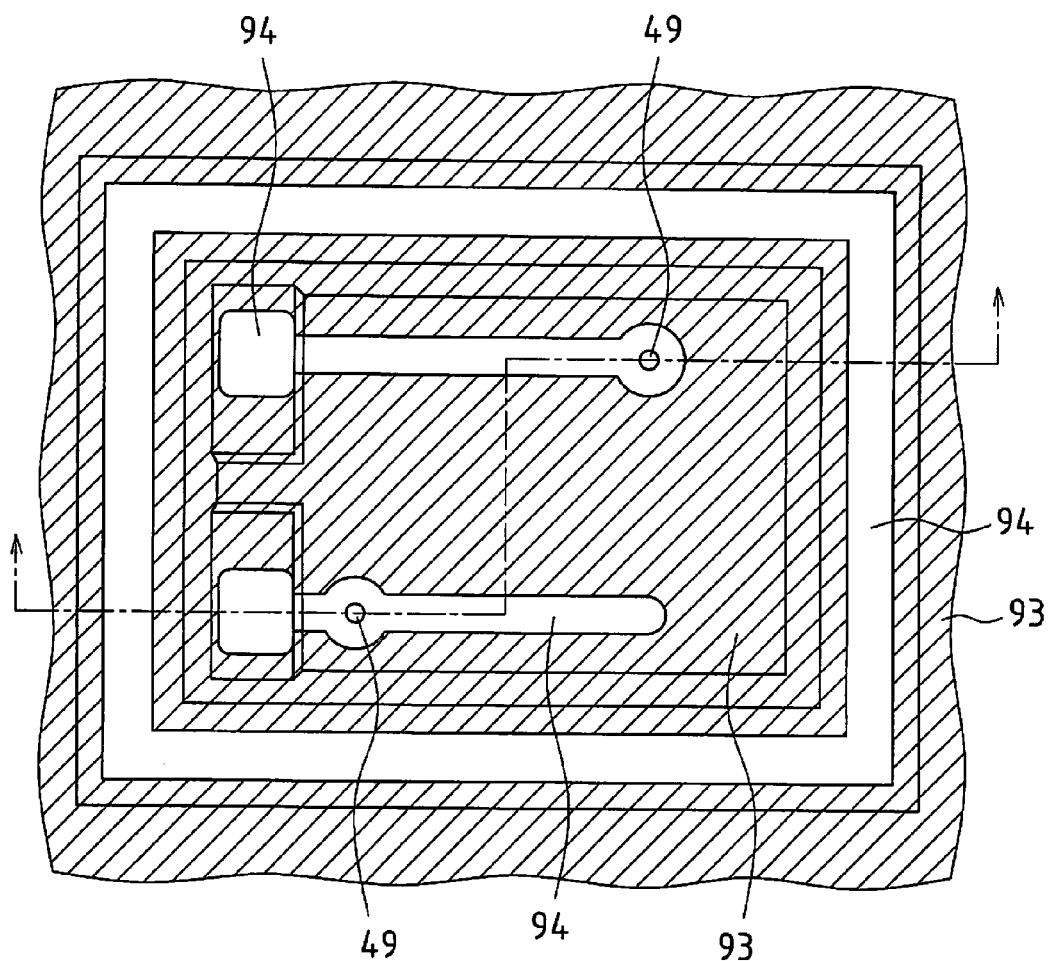
FIG. 19A is a schematic plan view of part of the wafer showing one step of the process for manufacturing the base according to Embodiment 1.
Figure 19B:
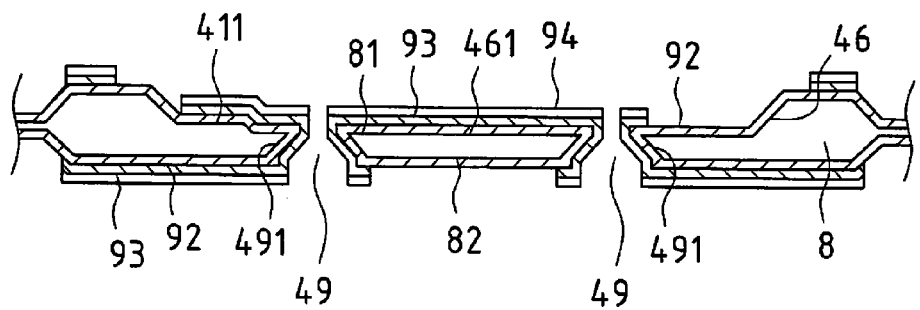
FIG. 19B is a schematic cross-sectional view in which the wafer shown in FIG. 19A has been cut along the dashed dotted line in FIG. 19A.

After the positive resist layers 94 have been formed on the wafer 8, in order to form the first bonding layer 45, the electrode pads 51 and 52, the external terminal electrodes 53 and 54, and the wiring patterns, the positive resist layers 94 on the wafer 8 are exposed to light and developed at portions other than those where the first bonding layer 45, the electrode pads 51 and 52, the external terminal electrodes 53 and 54, and the wiring patterns are to be formed, and, thus, as shown in FIGS. 19A and 19B, the metal layers 92 are exposed at the portions other than those where the first bonding layer 45, the electrode pads 51 and 52, the external terminal electrodes 53 and 54, and the wiring patterns are to be formed.

Figure 20A:
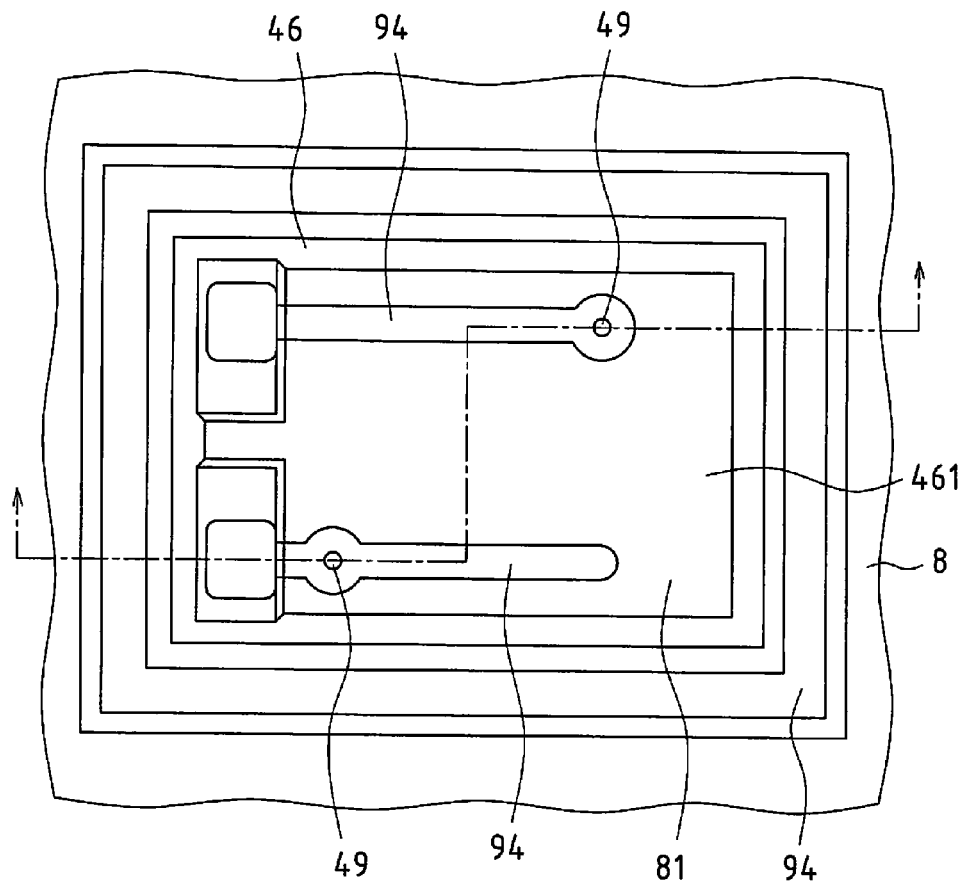
FIG. 20A is a schematic plan view of part of the wafer showing one step of the process for manufacturing the base according to Embodiment 1.
Figure 20B:
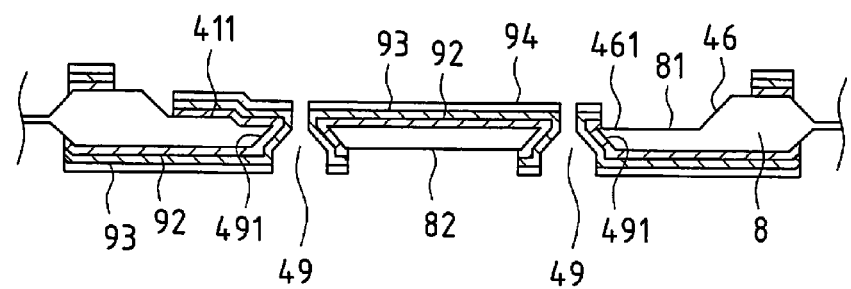
FIG. 20B is a schematic cross-sectional view in which the wafer shown in FIG. 20A has been cut along the dashed dotted line in FIG. 20A.

Subsequently, as shown in FIGS. 20A and 20B, the metal layers 92 exposed through the light exposure and the development are metal-etched and removed, and, thus, the first bonding layer 45, the electrode pads 51 and 52, the external terminal electrodes 53 and 54, and the wiring patterns are patterned.

Figure 21A:
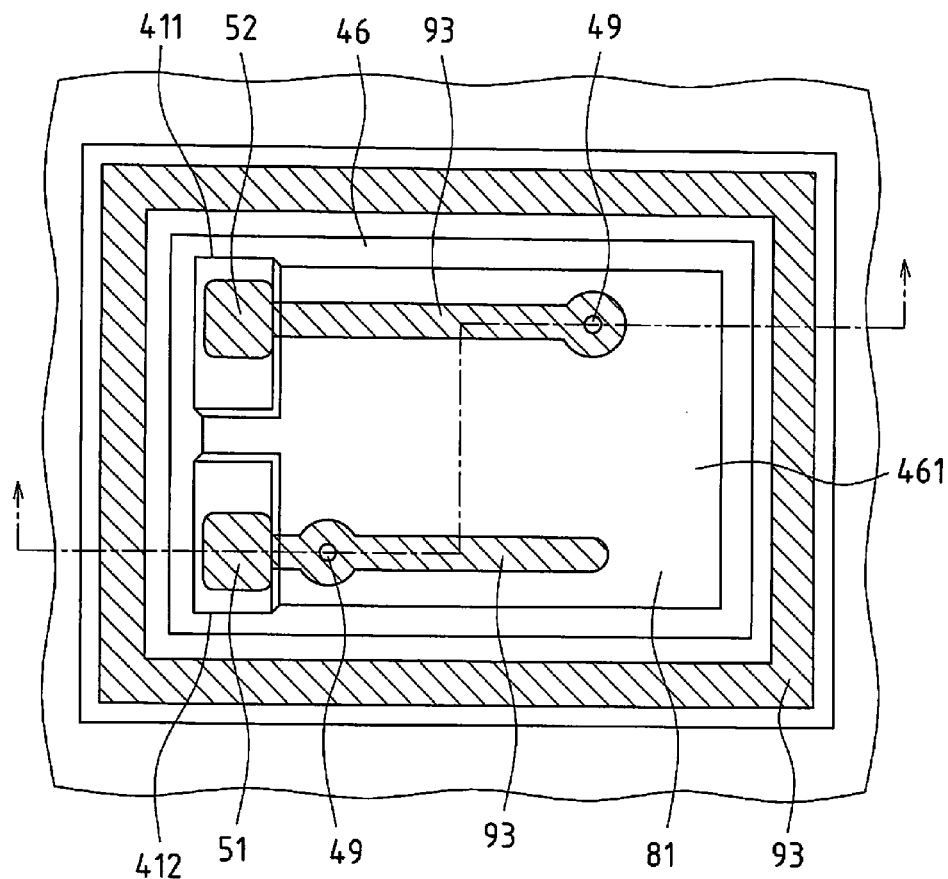
FIG. 21A is a schematic plan view of part of the wafer showing one step of the process for manufacturing the base according to Embodiment 1.
Figure 21B:
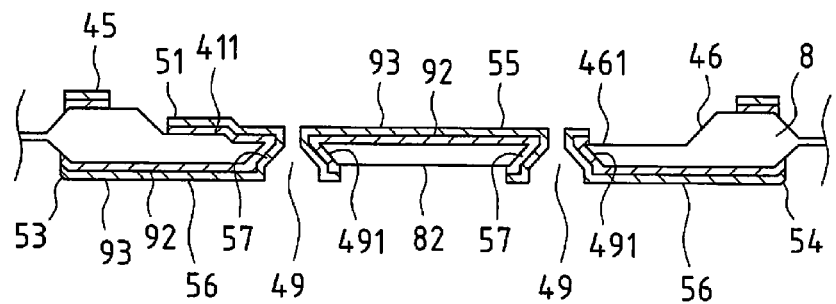
FIG. 21B is a schematic cross-sectional view in which the wafer shown in FIG. 21A has been cut along the dashed dotted line in FIG. 21A.

After the first bonding layer 45, the electrode pads 51 and 52, the external terminal electrodes 53 and 54, and the wiring patterns have been formed, as shown in FIGS. 21A and 21B, the positive resist layers 94 are peeled and removed.

Figure 22A:
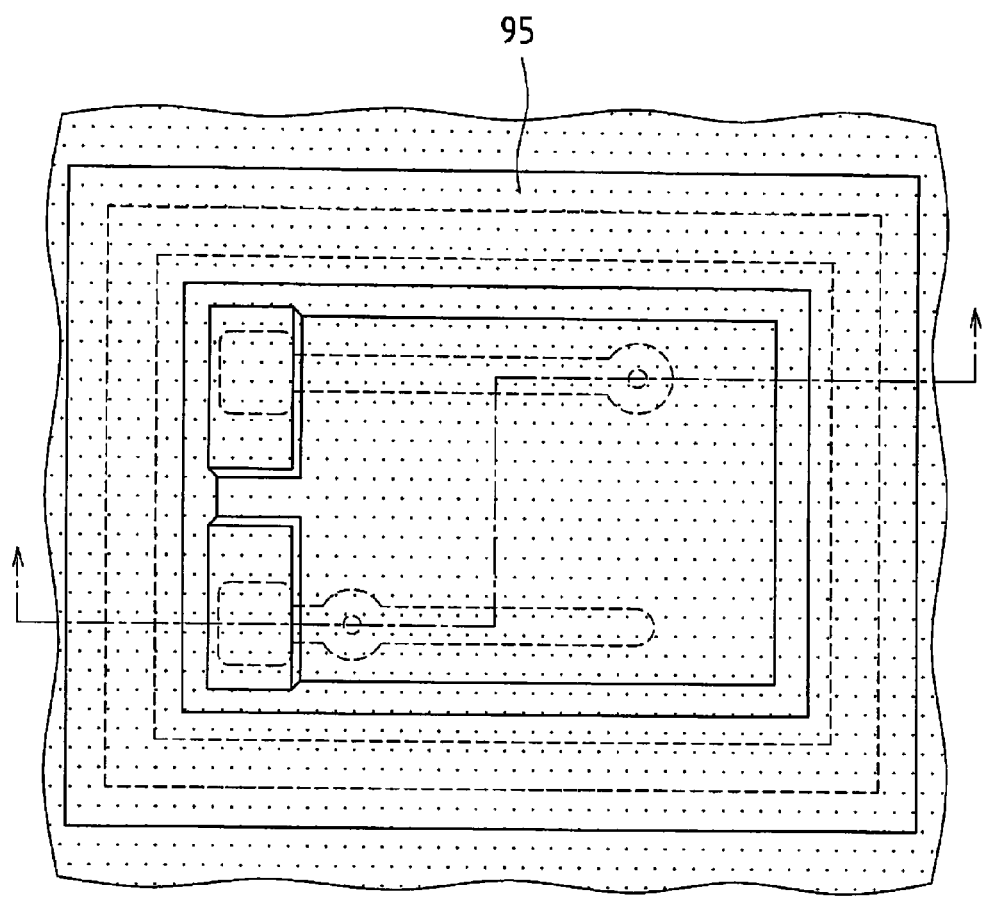
FIG. 22A is a schematic plan view of part of the wafer showing one step of the process for manufacturing the base according to Embodiment 1.
Figure 22B:
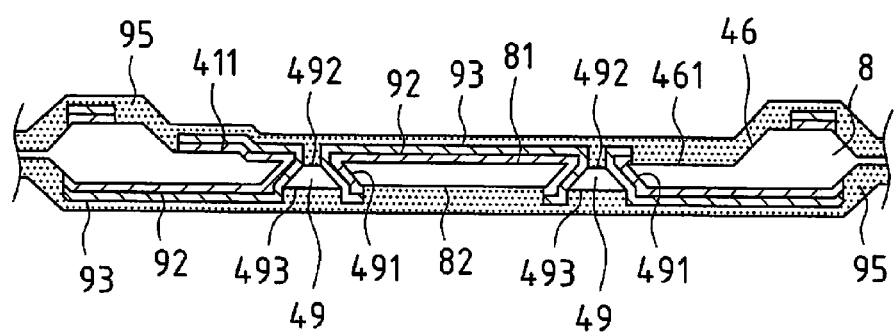
FIG. 22B is a schematic cross-sectional view in which the wafer shown in FIG. 22A has been cut along the dashed dotted line in FIG. 22A.

After the positive resist layers 94 have been peeled and removed from the wafer 8, as shown in FIGS. 22A and 22B, a photosensitive resin material is applied to the two main faces 81 and 82 of the wafer 8 and the open faces 492 and 493 of the through holes 49 by dip coating or spray coating to form resin layers 95.

Figure 23A:
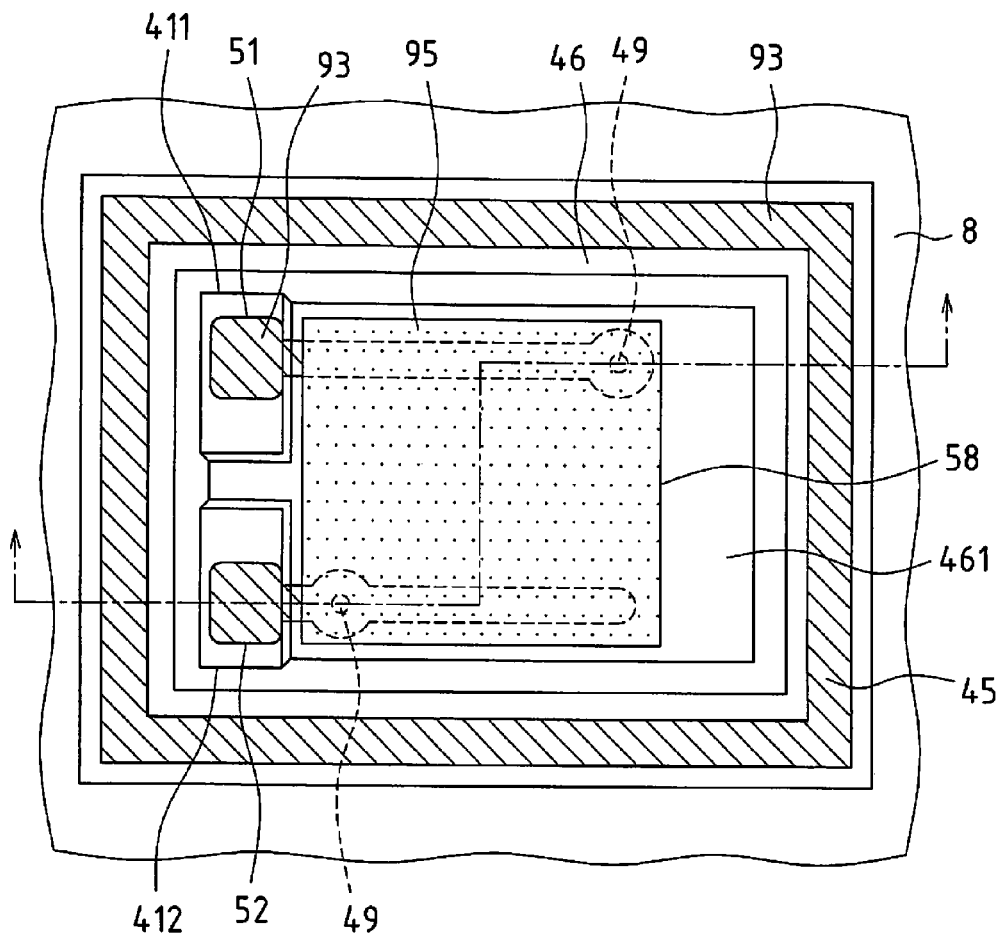
FIG. 23A is a schematic plan view of part of the wafer showing one step of the process for manufacturing the base according to Embodiment 1.
Figure 23B:
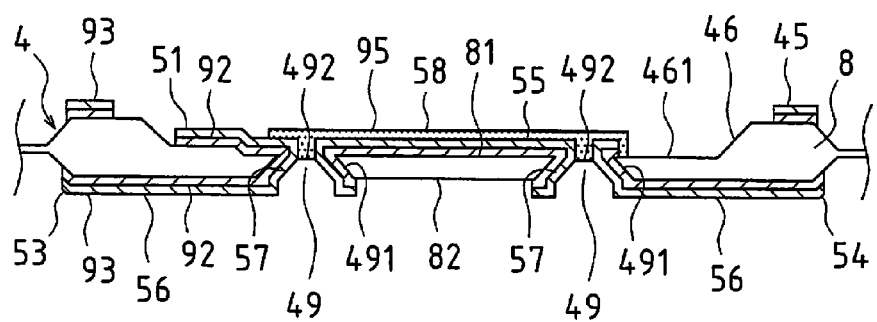
FIG. 23B is a schematic cross-sectional view in which the wafer shown in FIG. 23A has been cut along the dashed dotted line in FIG. 23A.

After the resin layers 95 have been formed on the wafer 8, as shown in FIGS. 23A and 23B, the resin layers 95 are exposed to light and developed at portions other than those where the resin pattern 58 is to be formed, and, thus, the resin pattern 58 is patterned. With the resin pattern 58, the open faces 492 of the through holes 49 on one main face (hereinafter, referred to as a "first main face") 81 side of the wafer 8 are sealed with the resin, and the surface of the wiring patterns (part of the internal electrodes 55) formed on the first main face 81 of the wafer 8 is coated.

After the resin pattern 58 has been formed, the large number of bases 4 formed on the wafer 8 are separated into each base to form a large number of bases 4 shown in FIGS. 2A to 2C.

The crystal resonator plate 2 shown in FIG. 4 is attached to the base 4 shown in FIGS. 2A to 2C, the crystal resonator plate 2 is electromechanically bonded by means of ultrasonic waves by FCB via a conductive bump to the base 4, and, thus, the crystal resonator plate 2 is mounted and held on the base 4. Furthermore, in another step, the bonding material 71 is layered on the second bonding layer 61 of the lid 6 (see FIGS. 3A and 3B). Subsequently, the lid 6 is temporarily bonded by FCB to the base 4 on which the crystal resonator plate 2 has been mounted and held. Furthermore, the bonding material 71, the first bonding layer 45, and the second bonding layer 61 are melted with application of heat in a nitrogen atmosphere, and, thus, the first bonding layer 45 of the base 4 and the second bonding layer 61 of the lid 6 are permanently bonded to each other via the bonding material 71 to form the crystal resonator 1 shown in FIG. 1.

Here, in the above-described process for manufacturing the base 4, the step of etching the wafer 8 to form the through holes 49 in the substrate of the base 4 is referred to as a through hole forming step. Furthermore, the step of forming the electrode pads 51 and 52, the external terminal electrodes 53 and 54, and the wiring patterns (i.e., the internal electrodes 55, the external electrodes 56, and the through electrodes 57) on the substrate of the base 4 with the metal layers 92 and the plated layers 93 patterned by photolithography is referred to as an electrode forming step. Furthermore, the step of patterning the resin pattern 58 by photolithography and sealing at least one side of the open faces 492 and 493 of the through holes 49 with a resin material (the resin pattern 58) is referred to as a hole sealing step.

In the crystal resonator 1 according to Embodiment 1, the through electrodes 57 are formed on the entire inner side faces 491 of the through holes 49, and, thus, the through electrodes 57 electrically connect the internal electrodes 55 formed on the first main face 42 of the base 4 and the external electrodes 56 formed on the second main face 43 of the base 4, and a stable conduction state at the through holes 49 is realized. Furthermore, the open faces 492 of the through holes 49 on the first main face 42 side of the base 4 are sealed with the resin pattern 58 (resin material), and, thus, the internal portion of the crystal resonator 1 package is not exposed to the outside air via the through holes 49, and the internal portion of the crystal resonator 1 package is kept sufficiently airtight. Furthermore, the resin pattern 58 is formed across at least half the region of the bottom face 461 of the cavity 46, and, thus, the resin pattern 58 increases the strength in the planar direction of the base 4.

Furthermore, in the crystal resonator 1 according to Embodiment 1, the resin pattern 58 is formed across a large area including the open faces 492 of the through holes 49 on the first main face 42 side of the base 4 and portions surrounding the open faces 492 (more specifically, across at least half the region of the bottom face 461 of the cavity 46), and, thus, the contact area in which the resin pattern 58 and the substrate (glass material) constituting the base 4 are in direct contact with each other is sufficiently secured. Accordingly, the bond strength of the resin pattern 58 to the substrate constituting the base 4 is sufficiently secured, and the airtight stability of the crystal resonator 1 package is sufficiently secured.

Embodiment 2

The configuration of the crystal resonator 1 according to Embodiment 2 is substantially the same as that of the crystal resonator 1 according to Embodiment 1. Thus, in the description below, only aspects different from those of the crystal resonator 1 of Embodiment 1 will be described.

The crystal resonator 1 according to Embodiment 2 is different from the crystal resonator 1 according to Embodiment 1 in the configuration of the base 4.

Figure 24A:
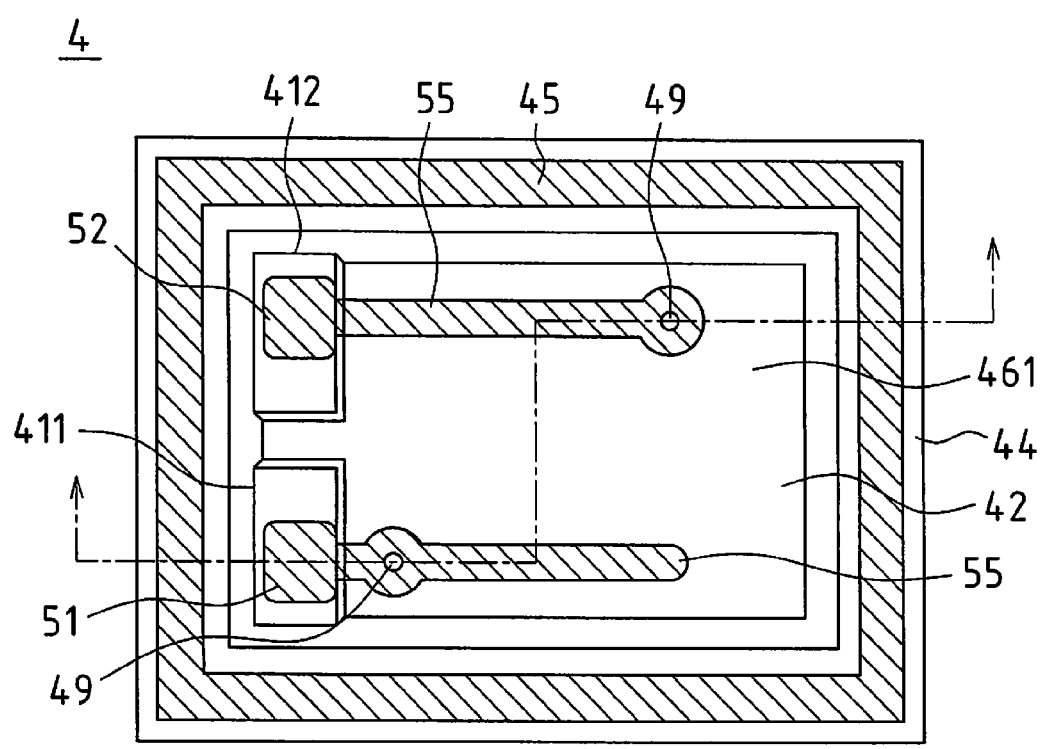
FIG. 24A is a schematic plan view of a base according to Embodiment 2.
Figure 24B:
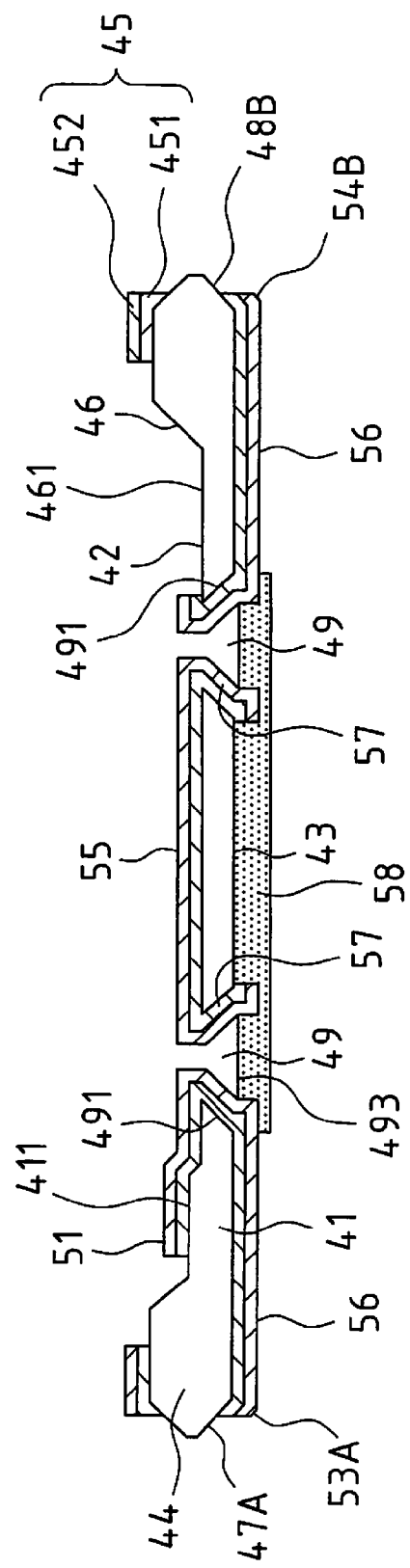
FIG. 24B is a schematic cross-sectional view of the base according to Embodiment 2, the base being cut along the dashed dotted line in FIG. 24A.
Figure 24C:
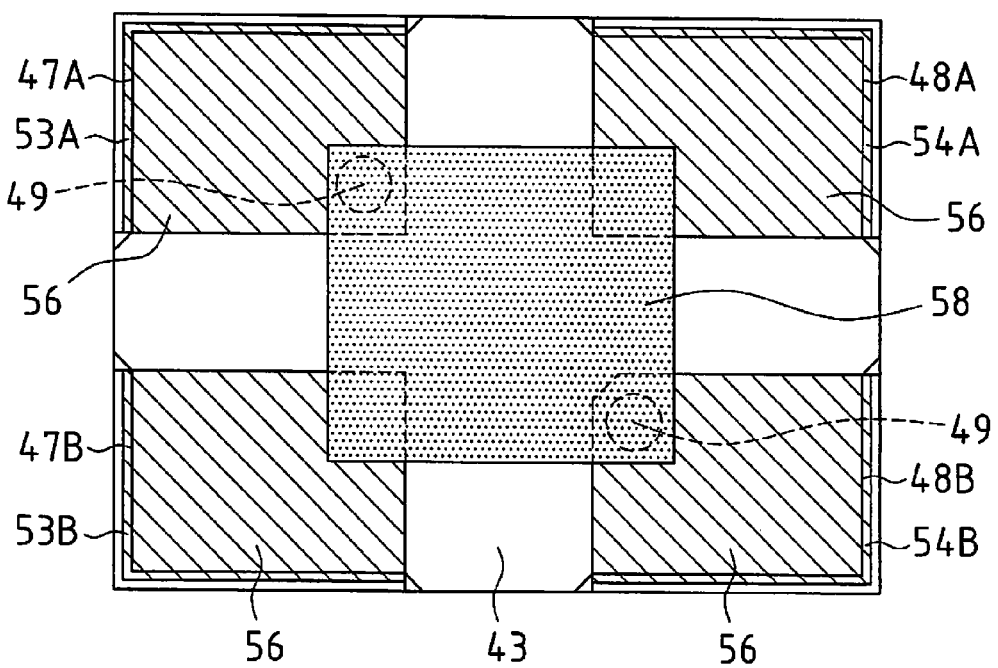
FIG. 24C is a schematic bottom view of the base according to Embodiment 2.

FIGS. 24A to 24C are schematic views showing the schematic configuration of the base 4 according to Embodiment 2, wherein FIG. 24A is a schematic plan view, FIG. 24B is a schematic cross-sectional view showing a state of a cut face obtained by cutting the base 4 along the dashed dotted line in FIG. 24A, and FIG. 24C is a schematic bottom view.

In the base 4 of the crystal resonator 1 according to Embodiment 2, as shown in FIGS. 24B and 24C, four castellations 47A, 47B, 48A, and 48B are arranged on the casing back face (the second main face 43) in the shape of a rectangle when viewed from above. More specifically, the castellation 47A extends from one end portion of one side along the longitudinal direction of the second main face 43, to one end portion of one side along the lateral direction that is adjacent to the one end portion, and the castellation 47B extends from one end portion of the other side along the longitudinal direction of the second main face 43, to the other end portion of the one side along the lateral direction that is adjacent to the one end portion. Furthermore, the castellation 48A extends from the other end portion of the one side along the longitudinal direction of the second main face 43, to one end portion of the other side along the lateral direction that is adjacent to the other end portion, and the castellation 48B extends from the other end portion of the other side along the longitudinal direction of the second main face 43, to the other end portion of the other side along the lateral direction that is adjacent to the other end portion.

External terminal electrodes 53A, 53B, 54A, and 54B are formed respectively on the four castellations 47A, 47B, 48A, and 48B. The external terminal electrode 53A and the electrode pad 51 are electrically connected to each other via a wiring pattern, and the external terminal electrode 54B and the electrode pad 52 are electrically connected to each other via a wiring pattern.

As shown in FIGS. 24A to 24C, the resin pattern 58 is formed not on the first main face 42 of the base 4 constituting the bottom face 461 of the cavity 46 but on the second main face 43 of the base 4 constituting the casing back face. More specifically, the resin pattern 58 is disposed at the position on the second main face 43 of the base 4 opposite the bottom face of the cavity 46, and the open faces 493 of the through holes 49 on the second main face 43 are sealed with the resin pattern 58.

Such a base 4 of the crystal resonator 1 according to Embodiment 2 is manufactured as in the base 4 of the crystal resonator 1 according to Embodiment 1, except that, in the manufacturing step shown in FIGS. 23A and 23B, the resin pattern 58 is formed not on the first main face 81 of the wafer 8 but on the other main face (hereinafter, referred to as a "second main face") 82 of the wafer 8.

In the crystal resonator 1 according to Embodiment 2, the through electrodes 57 are formed on the entire inner side faces 491 of the through holes 49, and, thus, the through electrodes 57 electrically connect the internal electrodes 55 formed on the first main face 42 of the base 4 and the external electrodes 56 formed on the second main face 43 of the base 4, and a stable conduction state inside the through holes 49 is realized. Furthermore, the open faces 493 of the through holes 49 on the second main face 43 side of the base 4 are sealed with the resin pattern 58 (resin material), and, thus, the internal portion of the crystal resonator 1 package is not exposed to the outside air via the through holes 49, and the internal portion of the crystal resonator 1 package is kept sufficiently airtight. Furthermore, the resin pattern 58 is formed at the position on the second main face 43 of the base 4 opposite the bottom face of the cavity 46, and, thus, the resin pattern 58 increases the strength in the planar direction of the base 4.

Furthermore, in the crystal resonator 1 according to Embodiment 2, the resin pattern 58 is formed across a large area including the open faces 493 of the through holes 49 on the second main face 43 side of the base 4 and portions surrounding the open faces 493 (more specifically, across at least half the region of the second main face 43 of the base 4 opposite the bottom face of the cavity 46), and, thus, the contact area in which the resin pattern 58 and the substrate (glass material) constituting the base 4 are in direct contact with each other is sufficiently secured. Accordingly, the bond strength of the resin pattern 58 to the substrate constituting the base 4 is sufficiently secured, and the airtight stability of the crystal resonator 1 package is sufficiently secured.

In the configuration of the crystal resonator 1 according to Embodiment 2, the constituent components other than those described above are as in the crystal resonator 1 according to Embodiment 1, and, thus, the crystal resonator 1 according to Embodiment 2 achieves effects similar to those in the crystal resonator 1 according to Embodiment 1.

Embodiment 3

The configuration of the crystal resonator 1 according to Embodiment 3 is substantially the same as that of the crystal resonator 1 according to Embodiment 1, and, thus, achieves effects similar to those in the crystal resonator 1 according to Embodiment 1. Thus, in the description below, only aspects different from those of the crystal resonator 1 of Embodiment 1 will be described.

The crystal resonator 1 according to Embodiment 3 is different from the crystal resonator 1 according to Embodiment 1 in the configuration of the base 4.

Figure 25A:
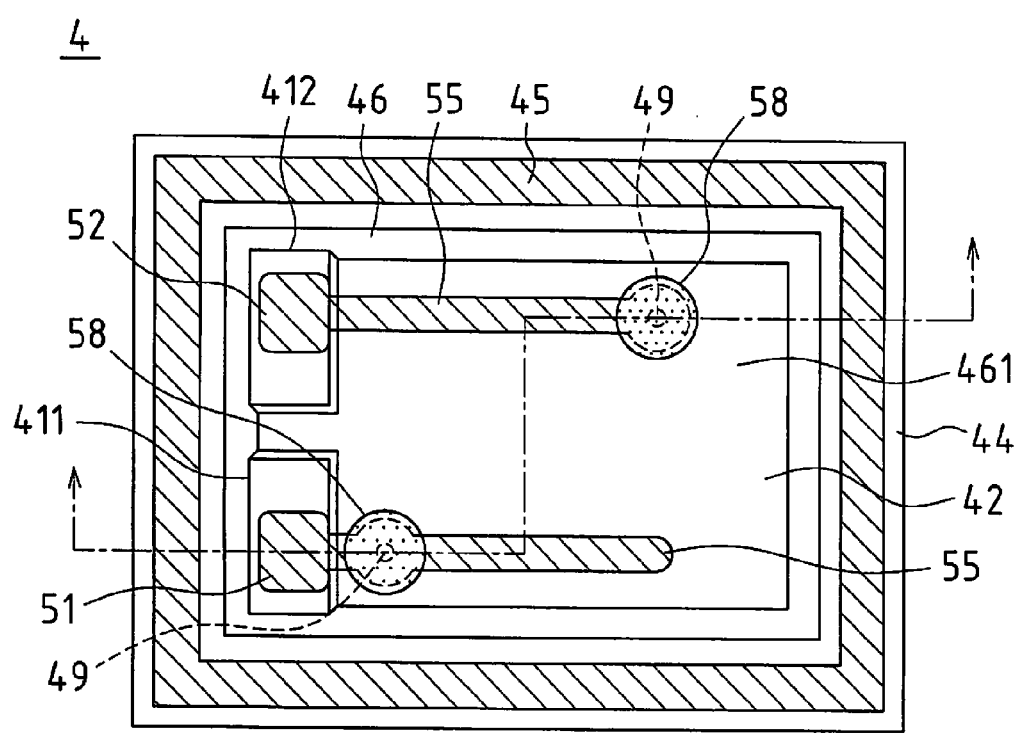
FIG. 25A is a schematic plan view of a base according to Embodiment 3.
Figure 25B:
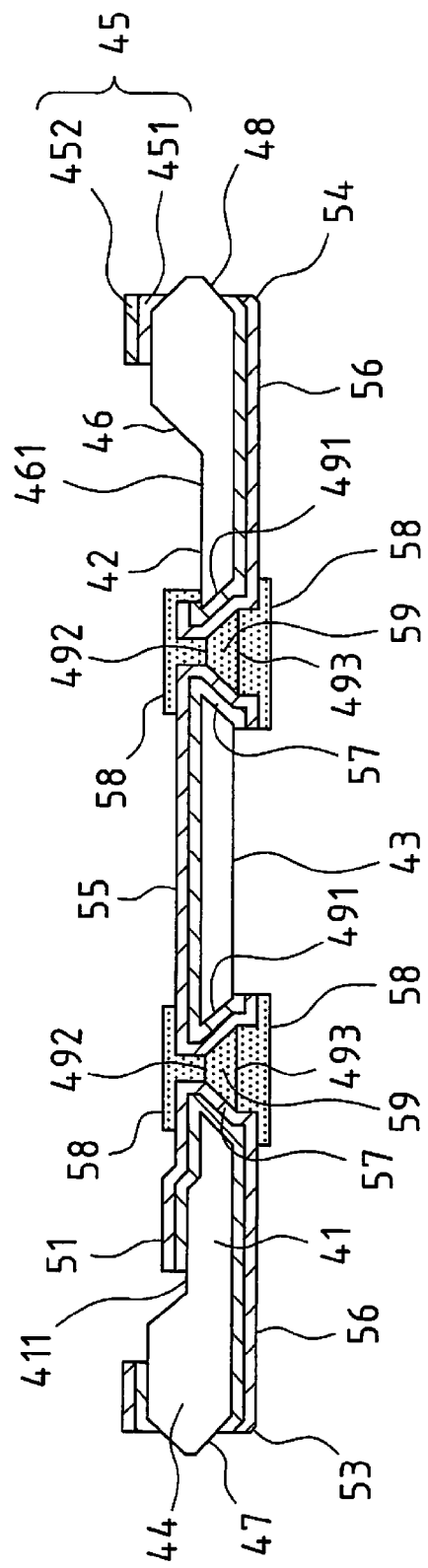
FIG. 25B is a schematic cross-sectional view of the base according to Embodiment 3, the base being cut along the dashed dotted line in FIG. 25A.
Figure 25C:
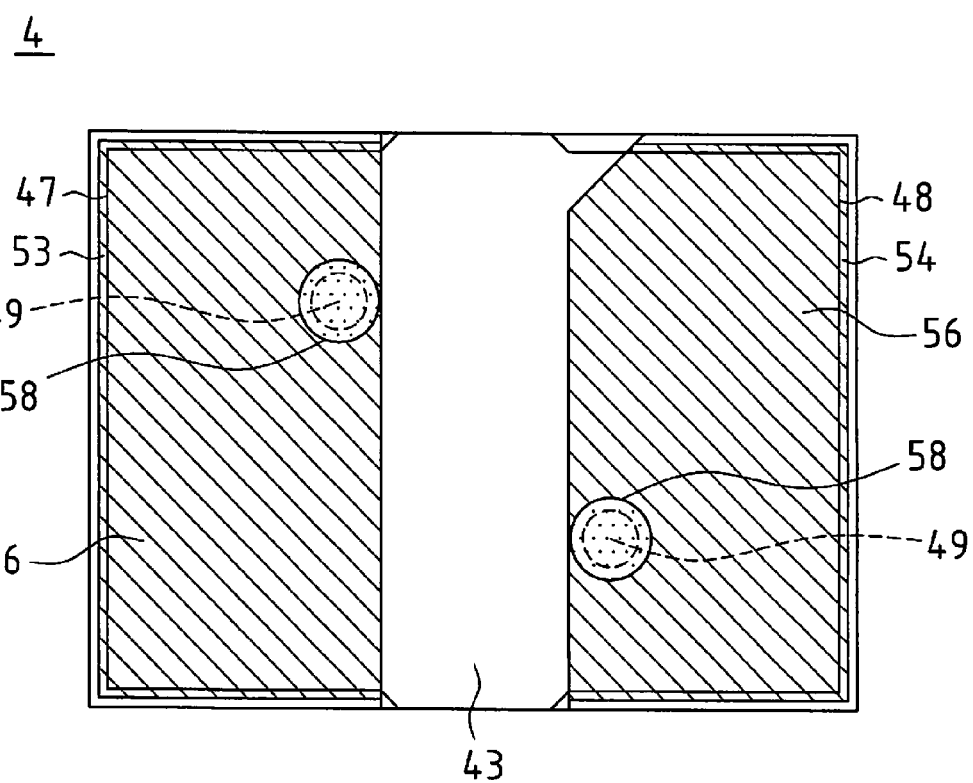
FIG. 25C is a schematic bottom view of the base according to Embodiment 3.

FIGS. 25A to 25C are schematic views showing the schematic configuration of the base 4 according to Embodiment 3, wherein FIG. 25A is a schematic plan view, FIG. 25B is a schematic cross-sectional view showing a state of a cut face obtained by cutting the base 4 along the dashed dotted line in FIG. 25A, and FIG. 25C is a schematic bottom view.

In the base 4 of the crystal resonator 1 according to Embodiment 3, as shown in FIGS. 25A to 25C, the resin patterns 58 are formed on the open faces 492 of the through holes 49 on the first main face 42 of the base 4 constituting the bottom face 461 of the cavity 46 and the vicinities of the open faces 492, and the open faces 493 of the through holes 49 on the second main face 43 of the base 4 constituting the casing back face and the vicinities of the open faces 493. That is to say, in Embodiment 3, the open faces 492 and 493 on both sides of the through holes 49 are sealed with the resin patterns 58.

Furthermore, in Embodiment 3, the internal portions of the through holes 49 are filled with a resin material 59 used for forming the resin patterns 58.

Such a base 4 of the crystal resonator 1 according to Embodiment 3 is manufactured as in the base 4 of the crystal resonator 1 according to Embodiment 1, except that, in the manufacturing step shown in FIGS. 22A and 22B, a resin containing a photosensitizer is applied to the two main faces 81 and 82 of the wafer 8 and the open faces 492 and 493 of the through holes 49 by dip coating to form the resin layers 95, and, at the same time, the resin material 59 is applied to fill the through holes 49, and that, in the manufacturing step shown in FIGS. 23A and 23B, the resin patterns 58 are formed only on the open faces 492 of the through holes 49 on the first main face 81 of the wafer 8 and the vicinities of the open faces 492, and the open faces 493 of the through holes 49 on the second main face 82 of the wafer 8 and the vicinities of the open faces 493.

In the crystal resonator 1 according to Embodiment 3, the through electrodes 57 are formed on the entire inner side faces 491 of the through holes 49, and, thus, the through electrodes 57 electrically connect the internal electrodes 55 formed on the first main face 42 of the base 4 and the external electrodes 56 formed on the second main face 43 of the base 4, and a stable conduction state inside the through holes 49 is realized. Furthermore, the open faces 492 and 493 on both sides of the through holes 49 are sealed with the resin patterns 58 (resin material), and the internal portions of the through holes 49 are filled with the resin material 59, and, thus, the internal portion of the crystal resonator 1 package is not exposed to the outside air via the through holes 49, and the internal portion of the crystal resonator 1 package is kept sufficiently airtight.

Here, in Embodiment 3, a resin material that is the same as the resin material forming the resin patterns 58 and does not contain a conductive substance is used as the resin material 59 used for filling the internal portions of the through holes 49. However, there is no limitation to this. For example, the resin material 59 used for filling the internal portions of the through holes 49 does not have to be the same as the resin material forming the resin patterns 58, and may contain a conductive substance. If the internal portions of the through holes 49 are filled with a resin material containing a conductive substance, the conduction state at the through holes 49 becomes more stable.

In the configuration of the crystal resonator 1 according to Embodiment 3, the constituent components other than those described above are as in the crystal resonator 1 according to Embodiment 1, and, thus, the crystal resonator 1 according to Embodiment 3 achieves effects similar to those in the crystal resonator 1 according to Embodiment 1.

Embodiment 4

The configuration of the crystal resonator 1 according to Embodiment 4 is substantially the same as that of the crystal resonator 1 according to Embodiment 1, and, thus, achieves effects similar to those in the crystal resonator 1 according to Embodiment 1. Thus, in the description below, only aspects different from those of the crystal resonator 1 of Embodiment 1 will be described.

The crystal resonator 1 according to Embodiment 4 is different from the crystal resonator 1 according to Embodiment 1 in the configuration of the base 4.

Figure 26A:
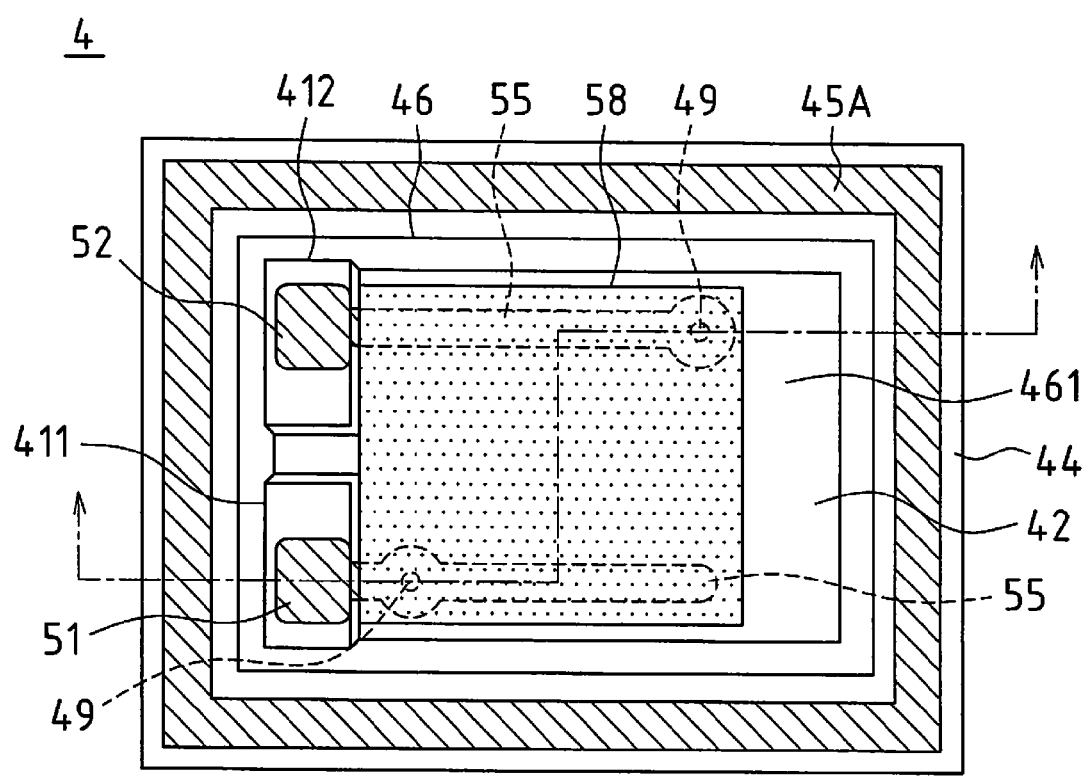
FIG. 26A is a schematic plan view of a base according to Embodiment 4.
Figure 26B:
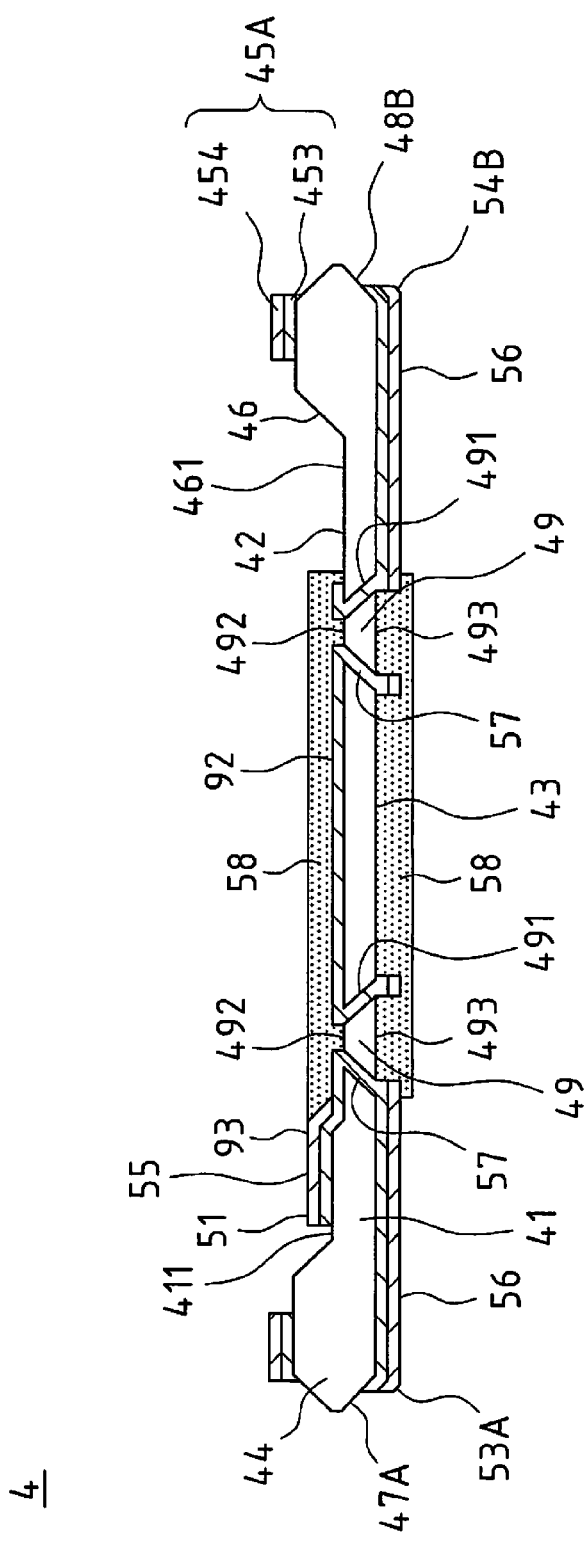
FIG. 26B is a schematic cross-sectional view of the base according to Embodiment 4, the base being cut along the dashed dotted line in FIG. 26A.
Figure 26C:
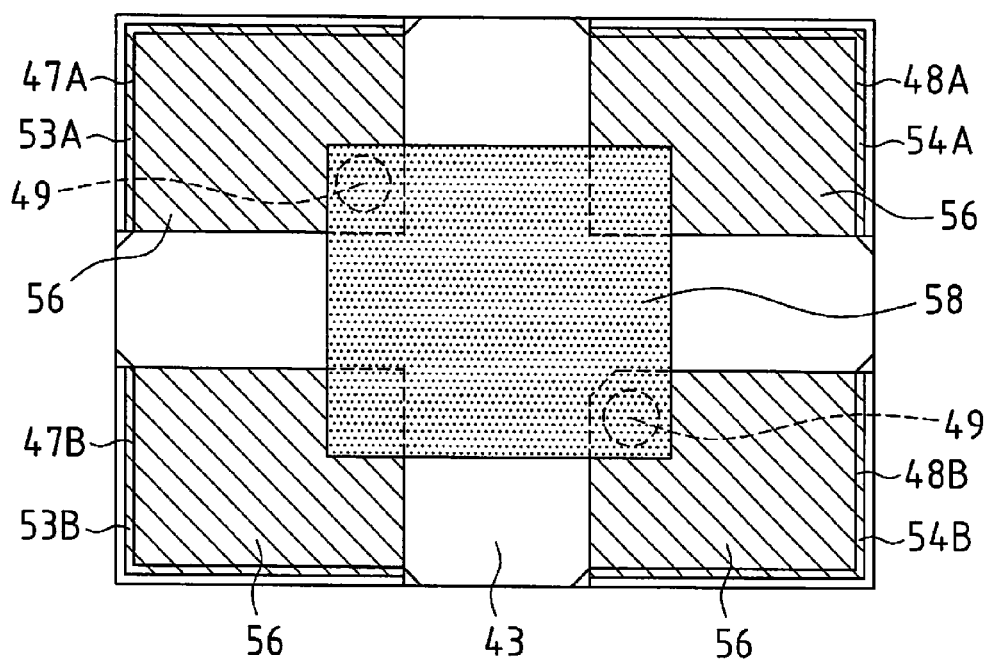
FIG. 26C is a schematic bottom view of the base according to Embodiment 4.

FIGS. 26A to 26C are schematic views showing the schematic configuration of the base 4 according to Embodiment 4, wherein FIG. 26A is a schematic plan view, FIG. 26B is a schematic cross-sectional view showing a state of a cut face obtained by cutting the base 4 along the dashed dotted line in FIG. 26A, and FIG. 26C is a schematic bottom view.

In the base 4 of the crystal resonator 1 according to Embodiment 4, as shown in FIGS. 26B and 26C, four castellations 47A, 47B, 48A, and 48B are arranged on the casing back face (the second main face 43) in the shape of a rectangle when viewed from above. More specifically, the castellation 47A extends from one end portion of one side along the longitudinal direction of the second main face 43, to one end portion of one side along the lateral direction that is adjacent to the one end portion, and the castellation 47B extends from one end portion of the other side along the longitudinal direction of the second main face 43, to the other end portion of the one side along the lateral direction that is adjacent to the one end portion. Furthermore, the castellation 48A extends from the other end portion of the one side along the longitudinal direction of the second main face 43, to one end portion of the other side along the lateral direction that is adjacent to the other end portion, and the castellation 48B extends from the other end portion of the other side along the longitudinal direction of the second main face 43, to the other end portion of the other side along the lateral direction that is adjacent to the other end portion.

The external terminal electrodes 53A, 53B, 54A, and 54B are formed respectively on the four castellations 47A, 47B, 48A, and 48B. The external terminal electrode 53A and the electrode pad 51 are electrically connected to each other via a wiring pattern, and the external terminal electrode 54B and the electrode pad 52 are electrically connected to each other via a wiring pattern.

Furthermore, as shown in FIGS. 26A to 26C, a first bonding layer 45A formed on the first main face of the base 4 has a configuration in which a plated film 454 is layered on a sputtered film 453 as in Embodiment 1. Here, the configurations of the sputtered film 453 and the plated film 454 are different from those in Embodiment 1.

That is to say, in the first bonding layer 45A of the base 4 of the crystal resonator 1 according to Embodiment 4, the sputtered film 453 is formed by forming a Cu film made of Cu by sputtering, on a Ti film made of Ti formed by sputtering. Furthermore, the plated film 454 is formed by plating an Ni film made of Ni on the sputtered film 453, and further plating an Au film made of Au on this Ni film.

Furthermore, the metal layers 92 constituting the electrodes 55, 56, and 57 of the base 4 are made of the same material as the sputtered film 453 constituting the first bonding layer 45A. Accordingly, in the process for manufacturing the base 4 of the crystal resonator 1 according to Embodiment 4, the protective layers 91 and the metal layers 92 are formed by forming a Ti layer made of Ti on the two main faces 81 and 82 of the wafer 8 by sputtering, and then forming a Cu layer on the Ti layer by sputtering (see FIGS. 6A, 6B, 14A, and 14B).

Furthermore, in Embodiment 4, in the internal electrodes 55, the part of the internal electrodes 55 corresponding to the electrode pads 51 and 52 connected to the driving electrodes of the crystal resonator plate is configured from the metal layer 92 and the plated layer 93, and the part of the internal electrodes 55 other than the electrode pads 51 and 52 is configured only from the metal layer 92 as shown in FIGS. 26A to 26C. Furthermore, all part of the external electrodes 56 including the external terminal electrodes 53A, 53B, 54A, and 54B is configured from the metal layer 92 and the plated layer 93.

Furthermore, in Embodiment 4, the plated layer 93 constituting the electrodes 55, 56, and 57 is made of the same material as the plated film 454 constituting the first bonding layer 45A. Accordingly, in the process for manufacturing the base 4 of the crystal resonator 1 according to Embodiment 4, the plated layers 93 are formed by plating Ni layers made of Ni on the metal layers 92, and then plating Au layers on the Ni layers (see FIGS. 16A and 16B).

Furthermore, in Embodiment 4, the resin patterns 58 are formed on the two main faces 42 and 43 of the base 4 as shown in FIGS. 26A to 26C. More specifically, the resin patterns 58 are formed on the bottom face 461 of the cavity 46 and the part of the casing back face opposite the bottom face 461 of the cavity 46. Accordingly, the open faces 492 and 493 on both sides of the through holes 49 are sealed with the resin material, and the surface of the part of the internal electrodes 55 other than the electrode pads 51 and 52, that is, the part of the internal electrodes 55 configured only from the plated layer 93 is coated with the resin. Moreover, the surface of part of the external electrodes 56 is coated with the resin. Accordingly, in the process for manufacturing the base 4 of the crystal resonator 1 according to Embodiment 4, the resin patterns 58 are formed on the two main faces 81 and 82 of the wafer 8.

The base 4 of the crystal resonator 1 according to Embodiment 4 is manufactured as in the base 4 of the crystal resonator 1 according to Embodiment 1 except for the aspect described above.

In the crystal resonator 1 according to Embodiment 4, as in the crystal resonator 1 according to Embodiment 1, the through electrodes 57 are formed on the entire inner side faces 491 of the through holes 49, and, thus, the through electrodes 57 electrically connect the internal electrodes 55 formed on the first main face 42 of the base 4 and the external electrodes 56 formed on the second main face 43 of the base 4, and a stable conduction state inside the through holes 49 is realized. Furthermore, the open faces 492 and 493 on both sides of the through holes 49 are sealed with the resin patterns 58 (resin material), and, thus, the internal portion of the crystal resonator 1 package is not exposed to the outside air via the through holes 49, and the internal portion of the crystal resonator 1 package is kept sufficiently airtight. Furthermore, the resin patterns 58 are formed on the two main faces 42 and 43 of the base 4, that is, the bottom face 461 of the cavity 46 and the part of the casing back face opposite the bottom face 461 of the cavity 46, and, thus, the resin patterns 58 increase the strength in the planar direction of the base 4.

Furthermore, in the crystal resonator 1 according to Embodiment 4, the resin patterns 58 are formed across a large area including the open faces 492 and 493 of the through holes 49 on the two main faces 42 and 43 sides of the base 4 and portions surrounding the open faces 493 (more specifically, across at least half the region of the bottom face 461 of the cavity 46, and at least half the region of the second main face 43 opposite the bottom face of the cavity 46), and, thus, the contact area in which the resin patterns 58 and the substrate (glass material) constituting the base 4 are in direct contact with each other is sufficiently secured. Accordingly, the bond strength of the resin patterns 58 to the substrate constituting the base 4 is sufficiently secured, and the airtight stability of the crystal resonator 1 package is sufficiently secured.

Furthermore, in the crystal resonator 1 according to Embodiment 4, the surface of the part of the internal electrodes 55 other than the electrode pads 51 and 52 is coated with the resin patterns 58, and, thus, the electrode surface (Cu layer) of the part of the internal electrodes 55 other than the electrode pads 51 and 52 is not oxidized. Furthermore, in the crystal resonator 1 according to Embodiment 4, Au is not used for the part of the internal electrodes 55 other than the electrode pads 51 and 52, that is, the part of the internal electrodes 55 coated with the resin patterns 58, and, thus, the necessary amount of Au used for forming the electrodes is smaller than that in Embodiment 1, and the manufacturing cost can be reduced.

Furthermore, in the crystal resonator 1 according to Embodiment 4, the second bonding layer formed on the lower face of the lid (not shown) is formed by layering a Ti film made of Ti, a Cu film made of Cu, and an Ni film made of Ni in this order from the lid side. The Ti film is formed by sputtering, the Cu film is formed on the Ti film by sputtering, and the Ni film is formed on the Cu film by plating.

Furthermore, a bonding material is layered on the second bonding layer of the lid before bonding to the base 4. The bonding material is configured from an Au/Sn film that is layered on the second bonding layer and an Au film that is layered on the Au/Sn film. Here, the Au/Sn film is configured from an Au film that is plated so as to be layered on the second bonding layer and an Sn film that is plated on this Au film. Furthermore, the Au film is configured from an Au strike plated film that is plated so as to be layered on the Au/Sn film and an Au plated film that is plated so as to be layered on this Au strike plated film. In such a bonding material, the Au/Sn film is melted with application of heat to form an AuSn alloy film. Here, the bonding material may be formed by plating an AuSn alloy on the second bonding layer of the lid.

In the configuration of the crystal resonator 1 according to Embodiment 4, the constituent components other than those described above are as in the crystal resonator 1 according to Embodiment 1, and, thus, the crystal resonator 1 according to Embodiment 4 achieves effects similar to those in the crystal resonator 1 according to Embodiment 1.

Here, in the base 4 of the crystal resonator 1 according to Embodiment 4, in the external electrodes 56, the part of the external electrodes 56 whose surface is coated with the resin patterns 58 may be configured only from the metal layer 92 configured from a Ti layer and a Cu layer. With this configuration, the necessary amount of Au used for forming the electrodes can be further reduced, and the cost can be further reduced.

Furthermore, in the crystal resonator 1 according to Embodiment 4, as the Ti film constituting the metal film of the first bonding layer 45, the Ti layer constituting the base layers of the metal layer 92 and the protective layers 91, and the Ti film constituting the base layer of the second bonding layer, a metal layer (metal film) that is well bonded to the material forming the wafer 8 (e.g., glass material) and Cu forming the Cu layer may be used instead, and examples thereof include a contact metal layer (contact metal film) made of W, Cr, or Mo.

Embodiment 5

Figure 27:
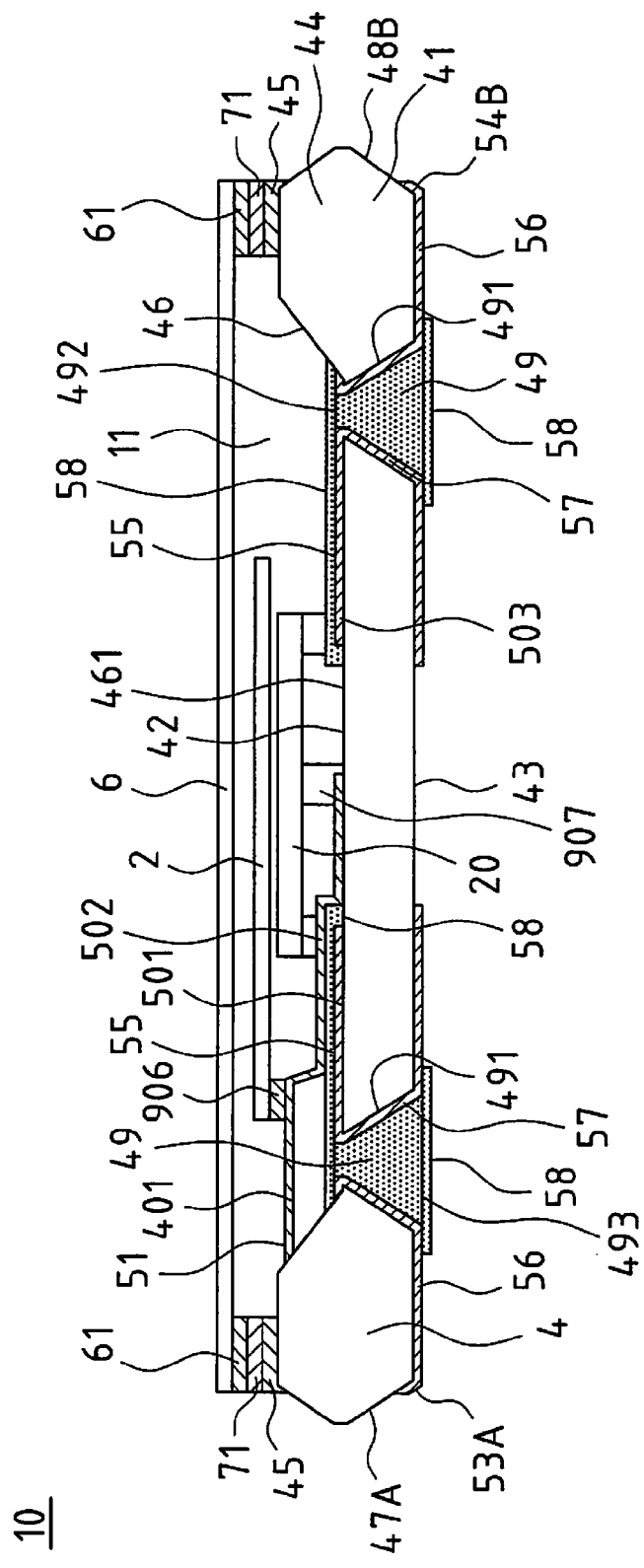
FIG. 27 is a schematic side view showing an internal space of a crystal oscillator according to Embodiment 5.
Figure 28A:
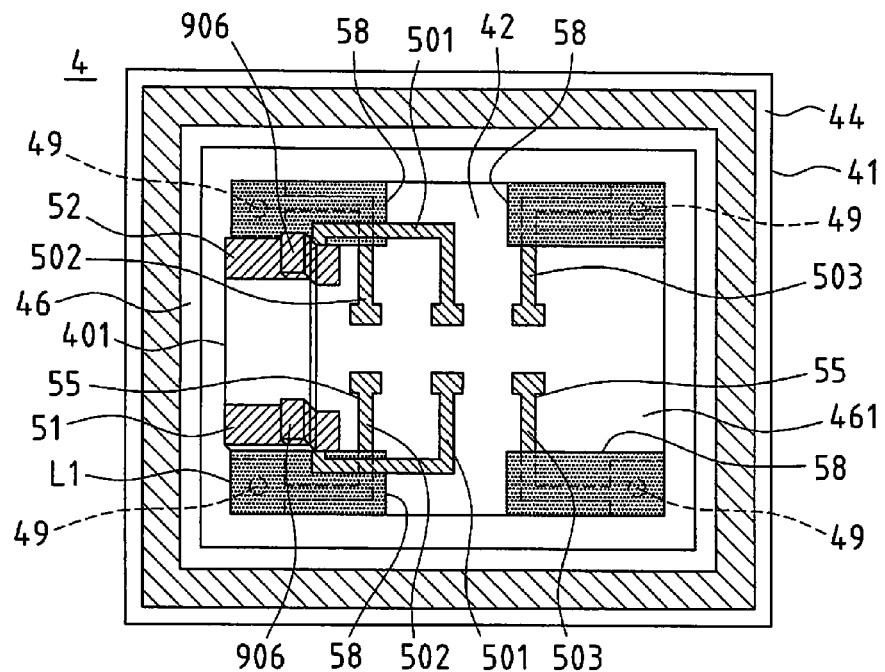
FIG. 28A is a schematic plan view of a base according to Embodiment 5.
Figure 28B:
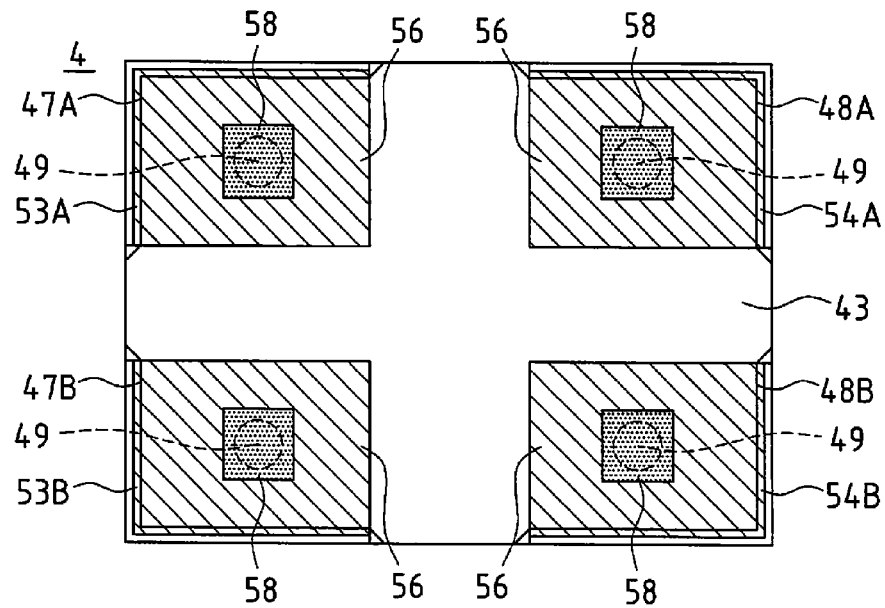
FIG. 28B is a schematic bottom view of the base according to Embodiment 5.

FIG. 27 is a schematic side view showing an internal space of a crystal oscillator according to Embodiment 5. FIGS. 28A and 28B are views showing the schematic configuration of a base of the crystal oscillator according to Embodiment 5, wherein FIG. 28A is a schematic plan view, and FIG. 28B is a schematic bottom view.

As shown in FIG. 27, a crystal oscillator 10 according to Embodiment 5 includes an IC chip 20 (an electronic component element in the present invention), the crystal resonator plate 2 (an electronic component element in the present invention) that is made of AT-cut crystal, the base 4 (an electronic component package sealing member as a first sealing member in the present invention) that holds the IC chip 20 and the crystal resonator plate 2 and is used for hermetically sealing the crystal resonator plate 2, and the lid 6 (a second sealing member in the present invention) that is disposed so as to oppose the base 4 and is used for hermetically sealing the driving electrodes 31 and 32 (electrodes of an electronic component element in the present invention) of the crystal resonator plate 2 held by the base 4.

In the crystal oscillator 10, as in the crystal resonator 1 according to Embodiment 1, a package (an electronic component package in the present invention) is configured from the base 4 and the lid 6, the base 4 and the lid 6 are bonded to each other by the bonding material 71 made of AuSn alloy, and, thus, the hermetically sealed internal space 11 is formed. In the internal space 11, the crystal resonator plate 2 is electromechanically bonded by means of ultrasonic waves to base 4 by FCB using conductive bumps 906 such as gold bumps. Here, as shown in FIG. 27, the IC chip 20 is bonded by means of ultrasonic waves by FCB using conductive bumps 907 such as gold bumps and electrically connected to the base 4 in the internal space 11.

Next, constituent components of the crystal oscillator 10 will be described. Here, the configurations of the lid 6 and the crystal resonator plate 2 are the same as those of the lid 6 and the crystal resonator plate 2 of the crystal resonator 1 according to Embodiment 1, and, thus a description thereof has been omitted.

The IC chip 20 is bonded by means of ultrasonic waves by FCB using the conductive bumps 907 such as gold bumps and electrically connected to the base 4 in the internal space 11. More specifically, the IC chip 20 includes six terminal electrodes (not shown), wherein two terminal electrodes of the six terminal electrodes are electrically connected via the electrode pads 51 and 52 and first wiring patterns 501 (described later) to the driving electrodes 31 and 32 of the crystal resonator plate 2, and the other four terminal electrodes are electrically connected via second wiring patterns 502 or third wiring patterns 503 (described later) of the base 4 to the external terminal electrodes 53A, 53B, 54A, and 54B arranged on the casing back face of the base 4.

As in the base 4 of Embodiment 1, the base 4 of the crystal oscillator 10 is made of glass material, and, as shown in FIG. 27, is formed in the shape of a box configured from the bottom portion 41 and the wall portion 44 extending upward from the bottom portion 41 along the outer periphery of the first main face 42 of the base 4. The base 4 is formed by etching a single plate in the shape of a rectangular solid by photolithography.

The top face of the wall portion 44 of the base 4 is a bonding face to the lid 6, and this bonding face includes the first bonding layer 45 that is to be bonded to the lid 6. The configuration of the first bonding layer 45 is the same as that of the first bonding layer 45 in the base 4 of Embodiment 1, and has a layered structure consisting of a plurality of layers in which a plated film is formed on a sputtered film. That is to say, the sputtered film is formed by forming an Au film made of Au by sputtering, on an Mo film made of Mo formed by sputtering. The plated film is formed by plating an Au film made of Au on the sputtered film.

As in the base 4 of Embodiment 1, the cavity 46 surrounded by the bottom portion 41 and the wall portion 44 is formed in the base 4 of the crystal oscillator 10, and, as shown in FIGS. 27, 28A, and 28B, the cavity 46 is formed in the shape of a rectangle when viewed from above, and the wall face of the cavity 46 is tapered.

The bottom face 461 of the cavity 46 includes one pedestal portion 401 that is in contact only with the center portion of the side L1 along the lateral direction.

In the base 4, four castellations 47A, 47B, 48A, and 48B are arranged on the casing back face (the second main face 43) in the shape of a rectangle when viewed from above. More specifically, the castellation 47A extends from one end portion of one side along the longitudinal direction of the second main face 43, to one end portion of one side along the lateral direction that is adjacent to the one end portion, and the castellation 47B extends from one end portion of the other side along the longitudinal direction of the second main face 43, to the other end portion of the one side along the lateral direction that is adjacent to the one end portion. Furthermore, the castellation 48A extends from the other end portion of the one side along the longitudinal direction of the second main face 43, to one end portion of the other side along the lateral direction that is adjacent to the other end portion, and the castellation 48B extends from the other end portion of the other side along the longitudinal direction of the second main face 43, to the other end portion of the other side along the lateral direction that is adjacent to the other end portion.

Furthermore, in the base 4, as shown in FIGS. 27, 28A, and 28B, through holes 49 that pass through the substrate of the base 4 are formed respectively at four corners of the bottom face 461 of the cavity 46. The inner side faces 491 of the through holes 49 are tapered so as to be inclined with respect to the first main face 42 and the second main face 43 of the base 4. The through holes 49 have a diameter that is largest at an end portion on the second main face 43 side of the base 4 and is smallest at an end portion on the first main face 42 side of the base 4.

Furthermore, on the substrate of the base 4, formed are the pair of electrode pads 51 and 52 that are electromechanically bonded respectively to the driving electrodes 31 and 32 of the crystal resonator plate 2, the external terminal electrodes 53A, 53B, 54A, and 54B that are electrically connected to external components and external devices, the first wiring patterns 501 that electrically connect the electrode pads 51 and 52 and electrodes (not shown) of the IC chip 20, the second wiring patterns 502 that electrically connect the external terminal electrodes 53A and 53B and electrodes (not shown) of the IC chip 20, and the third wiring patterns 503 that electrically connect the external terminal electrodes 54A and 54B and electrodes (not shown) of the IC chip 20. The electrode pads 51 and 52, the external terminal electrodes 53A, 53B, 54A, and 54B, the first wiring patterns 501, the second wiring patterns 502, and the third wiring patterns 503 constitute the electrodes 55, 56, and 57 of the base 4. The electrode pads 51 and 52 are formed on the surface of the pedestal portion 401. The conductive bumps 906 for bonding the crystal resonator plate 2 are arranged on the electrode pads 51 and 52. Furthermore, the external terminal electrodes 53A, 53B, 54A, and 54B are formed on the castellations 47A, 47B, 48A, and 48B. Furthermore, the first wiring patterns 501 are formed so as to extend from the electrode pads 51 and 52 to a bonding portion to which the IC chip 20 is bonded on the first main face 42 of the base 4. The second wiring patterns 502 and the third wiring patterns 503 are formed so as to extend from the bonding portion to which the IC chip 20 is bonded on the first main face 42 of the base 4, via the inner side faces 491 of the through holes 49, to the external terminal electrodes 53A, 53B, 54A, and 54B of the second main face 43.

The electrode pads 51 and 52, the external terminal electrodes 53A, 53B, 54A, and 54B, the first wiring patterns 501, the second wiring patterns 502, and the third wiring patterns 503 are made of the same material as the first bonding layer 45.

Furthermore, the resin patterns 58 (resin material) are arranged at four corners of the bottom face 461 of the cavity 46 (the first main face 42 of the base 4) at which the through holes 49 are formed, the open faces 493 of the through holes 49 of the casing back face of the base 4 (the second main face 43), and the vicinities of the open faces 493. That is to say, the open faces 492 of the through holes 49 on the first main face 42 side of the base 4 and the open faces 493 of the through holes 49 on the second main face 43 side of the base 4 are sealed with the resin patterns 58, and the surface of part of the second wiring patterns 502 and the third wiring patterns 503 is coated with the resin. Furthermore, the internal portions of the through holes 49 are filled with the resin material. Here, as the resin material forming the resin patterns 58 and the resin material used for filling the internal portions of the through holes 49, the resin material that is the same as the resin material forming the resin patterns 58 in the base 4 of Embodiment 1 may be used.

Furthermore, as shown in FIGS. 27, 28A, and 28B, the first wiring patterns 501 and the second wiring patterns 502 are formed so as to intersect each other, and at the intersecting portions, the resin patterns 58 are interposed between the first wiring patterns 501 and the second wiring patterns 502. That is to say, electrodes (another electrode in the present invention) constituting part of the first wiring patterns 501 are formed via the resin patterns 58 on the internal electrodes 55 constituting part of the second wiring patterns 502.

In the crystal oscillator 10 according to Embodiment 5, the through electrodes 57 are formed on the entire inner side faces 491 of the through holes 49, and, thus, the through electrodes 57 electrically connect the internal electrodes 55 formed on the first main face 42 of the base 4 and the external electrodes 56 formed on the second main face 43 of the base 4, and a stable conduction state at the through holes 49 is realized. Furthermore, the open faces 492 of the through holes 49 on the first main face 42 side of the base 4 and the open faces 493 of the through holes 49 on the second main face 43 side of the base 4 are sealed with the resin patterns 58 (resin material), and the internal portions of the through holes 49 are filled with the resin material, and, thus, the internal portion of the crystal oscillator 10 package is never exposed to the outside air via the through holes 49, and the internal portion of the crystal oscillator 10 package is kept sufficiently airtight. Furthermore, electrodes constituting part of the first wiring patterns 501 are further formed via the resin patterns 58 on the internal electrodes 55 constituting part of the second wiring patterns 502, and, thus, the base 4 has a configuration in which a plurality of wiring patterns are arranged in the thickness direction of the base 4.

The base 4 of the crystal oscillator 10 according to Embodiment 5 is manufactured as in the base 4 of the crystal resonator 1 according to Embodiment 1, except that, after forming the resin patterns 58, electrodes are further formed on the resin patterns 58.

In the configuration of the crystal oscillator 10 according to Embodiment 5, the constituent components other than those described above are as in the crystal resonator 1 according to Embodiment 1, and, thus, the crystal oscillator 10 according to Embodiment 5 achieves effects similar to those in the crystal resonator 1 according to Embodiment 1.

Embodiment 6

The configuration of the crystal resonator 1 according to Embodiment 6 is substantially the same as that of the crystal resonator 1 according to Embodiment 1. Thus, in the description below, only aspects different from those of the crystal resonator 1 of Embodiment 1 will be described.

The crystal resonator 1 according to Embodiment 6 is different from the crystal resonator 1 according to Embodiment 1 in the configuration of the base 4.

Figure 29A:
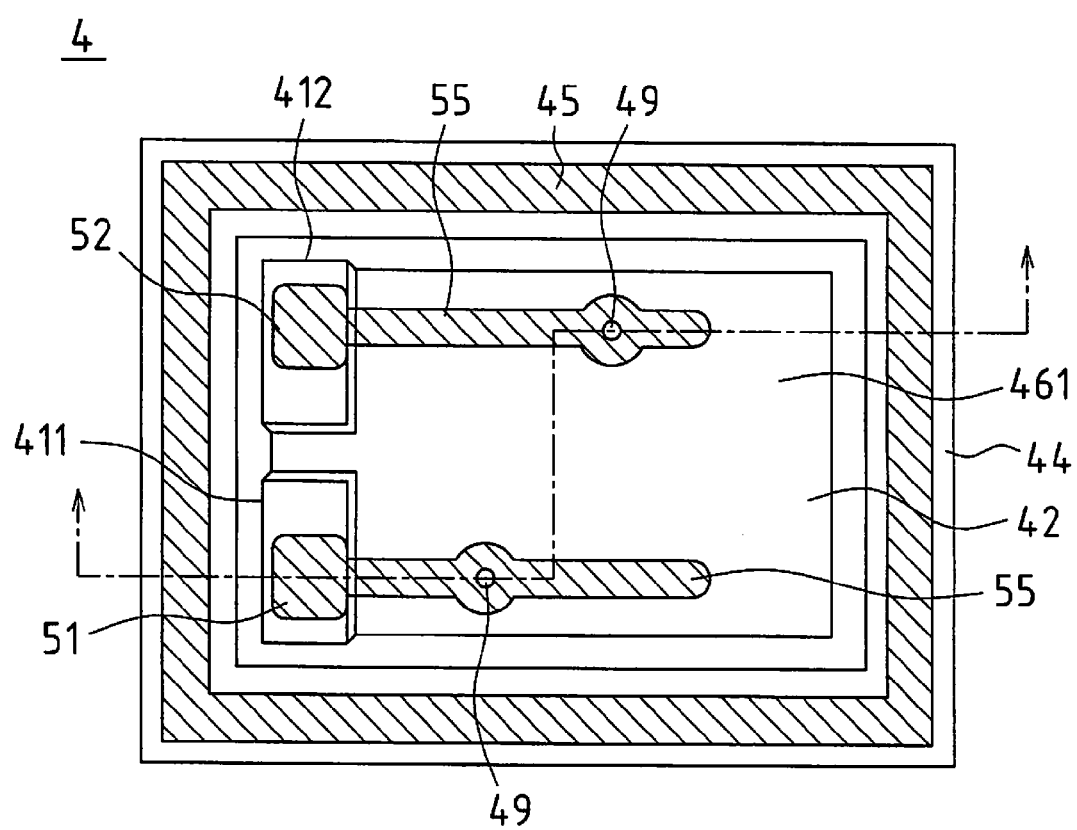
FIG. 29A is a schematic plan view of a base according to Embodiment 6.
Figure 29B:
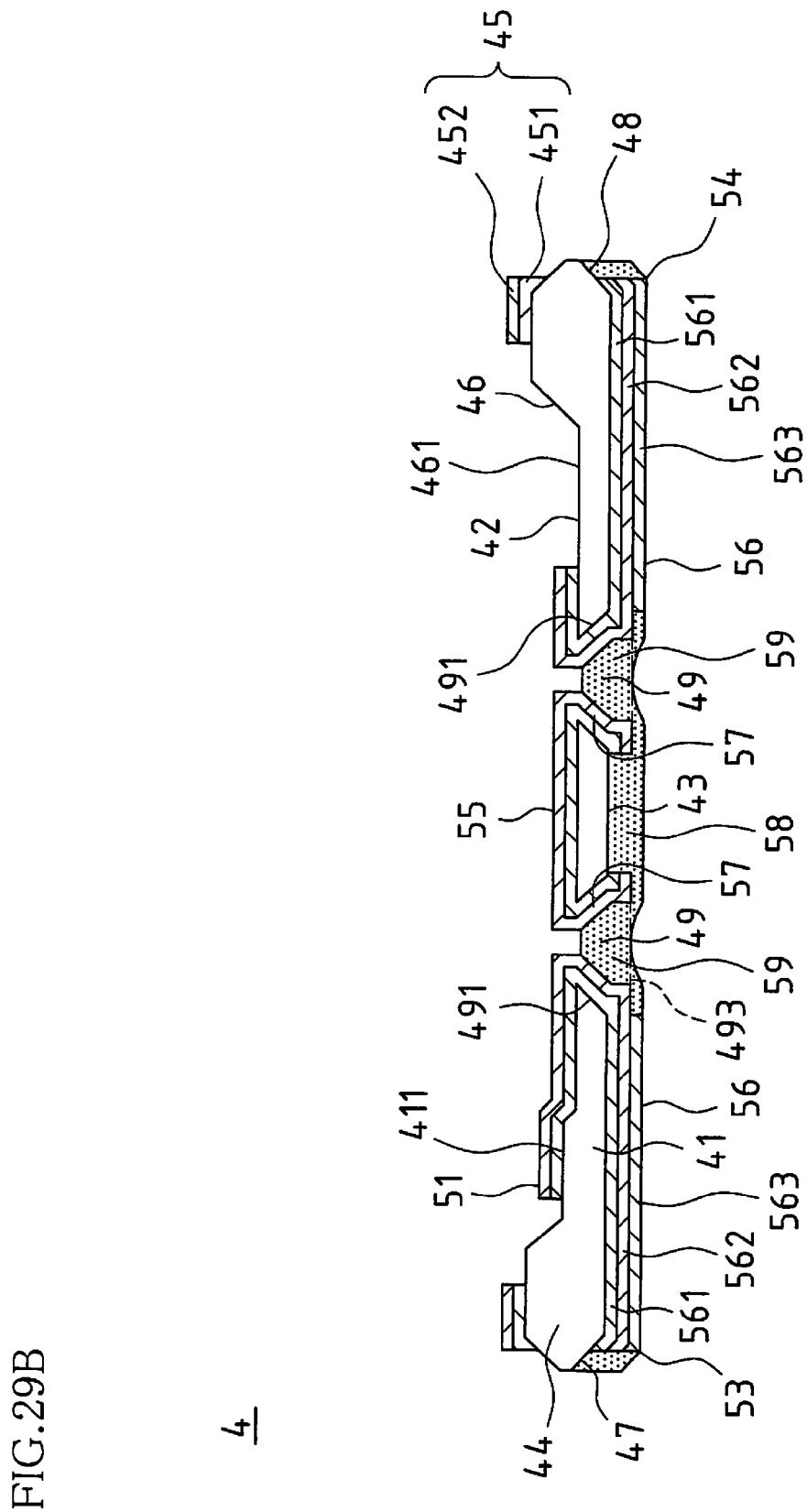
FIG. 29B is a schematic cross-sectional view of the base according to Embodiment 6, the base being cut along the dashed dotted line in FIG. 29A.
Figure 29C:
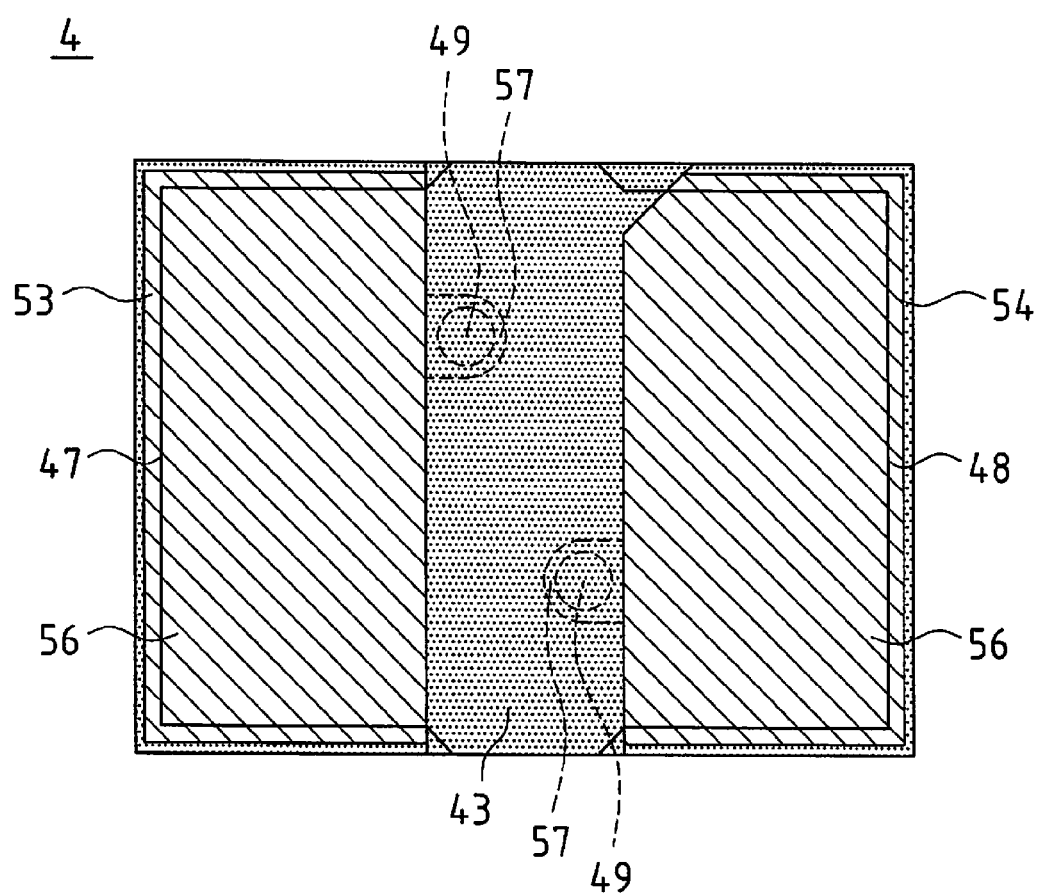
FIG. 29C is a schematic bottom view of the base according to Embodiment 6.

FIGS. 29A to 29C are schematic views showing the schematic configuration of the base 4 according to Embodiment 6, wherein FIG. 29A is a schematic plan view, FIG. 29B is a schematic cross-sectional view showing a state of a cut face obtained by cutting the base 4 along the dashed dotted line in FIG. 29A, and FIG. 29C is a schematic bottom view.

As shown in FIGS. 29A to 29C, the resin pattern 58 is formed not on the first main face 42 of the base 4 constituting the bottom face 461 of the cavity 46 but on the second main face 43 of the base 4 constituting the casing back face. More specifically, as shown in FIGS. 29A to 29C, the resin pattern 58 is formed on the open faces 493 of the through holes 49 on the second main face 43 of the base 4 constituting the casing back face and the vicinities of the open faces 493, and the entire region of the second main face 43 excluding the region in which the external electrodes 56 (the external terminal electrodes 53 and 54) are formed. That is to say, in Embodiment 6, the open faces 493 of the through holes 49 are sealed with the resin pattern 58, and the entire second main face 43 is coated with the resin pattern 58 or the external electrodes 56. Furthermore, in Embodiment 6, the two through holes 49 on the base 4 are formed so as to be closer to each other than the two through holes 49 formed on the base 4 of Embodiment 1 described above (see FIGS. 2A to 2C).

Furthermore, in Embodiment 6, the internal portions of the through holes 49 are filled with the resin material 59 used for forming the resin pattern 58.

Furthermore, the external electrodes 56 have a configuration in which a second plated film 563 is further layered on a sputtered film 561 and a plated film 562 that are made of the same materials as the sputtered film 451 and the plated film 452 of the first bonding layer 45. That is to say, the sputtered film 561 of the external electrodes 56 is formed by forming an Au film made of Au by sputtering, on an Mo film made of Mo formed by sputtering. The plated film 562 is formed by plating an Au film made of Au on the sputtered film 561. The second plated film 563 is formed by further plating a metal film on the plated film 562. Specific examples of metal films constituting the second plated film 563 include an Au film plated on the plated film 562, an AuCu alloy film made of AuCu alloy plated on the plated film 562, and an Ni/Au film formed by plating an Au film on an Ni film that is plated on the plated film 562.

Such a base 4 of the crystal resonator 1 according to Embodiment 6 is manufactured as in the base 4 of the crystal resonator 1 according to Embodiment 1, except that, in the manufacturing step shown in FIGS. 22A and 22B, a resin containing a photosensitizer is applied to the two main faces 81 and 82 of the wafer 8 and the open faces 492 and 493 of the through holes 49 by dip coating to form the resin layers 95, and, at the same time, the resin material 59 is applied to fill the through holes 49, and that, in the manufacturing step shown in FIGS. 23A and 23B, the resin pattern 58 is formed on the open faces 493 of the through holes 49 on the second main face 82 of the wafer 8 and the vicinities of the open faces 493, and the entire region of the second main face 43 excluding the region in which the external electrodes 56 (the external terminal electrodes 53 and 54) are formed, and the second metal layers constituting the second plated films 563 of the external electrodes 56 are plated on the metal layers 93 (see FIG. 23B) constituting the plated films 562 of the external electrodes 56.

In the crystal resonator 1 according to Embodiment 6, the through electrodes 57 are formed on the entire inner side faces 491 of the through holes 49, and, thus, the through electrodes 57 electrically connect the internal electrodes 55 formed on the first main face 42 of the base 4 and the external electrodes 56 formed on the second main face 43 of the base 4, and a stable conduction state inside the through holes 49 is realized. Furthermore, the open faces 493 on one side of the through holes 49 are sealed with the resin pattern 58 (resin material), and the internal portions of the through holes 49 are filled with the resin material 59, and, thus, the internal portion of the crystal resonator 1 package is not exposed to the outside air via the through holes 49, and the internal portion of the crystal resonator 1 package is kept sufficiently airtight.

Furthermore, in the base 4 according to Embodiment 6, the resin pattern 58 is formed on the open faces 493 of the through holes 49 on the second main face 43 of the base 4 constituting the casing back face and the vicinities of the open faces 493, and the entire region of the second main face 43 excluding the region in which the external electrodes 56 (the external terminal electrodes 53 and 54) are formed, and, thus, the contact area in which the resin pattern 58 and the substrate (glass material) constituting the base 4 are in direct contact with each other is sufficiently secured. Accordingly, the bond strength of the resin pattern 58 to the substrate constituting the base 4 is sufficiently secured, and the airtight stability of the crystal resonator 1 package is sufficiently secured.

Furthermore, in the base 4 according to Embodiment 6, the entire end portion along the outer peripheral edge of the second main face 43 is coated with the resin pattern 58. That is to say, when manufacturing the base 4 according to Embodiment 6 as in Embodiment 1, the resin pattern 58 is formed at a portion of the wafer 8 that is to be cut when dicing the wafer 8 into each base 4, and, thus, the cut portion of the wafer 8 is coated with the resin material. Accordingly, in manufacture of the base 4 according to Embodiment 6, the resin material that coats the cut portion of the wafer 8 suppresses chipping of the wafer (glass material) caused by dicing.

Here, in Embodiment 6, a resin material that is the same as the resin material forming the resin pattern 58 and does not contain a conductive substance is used as the resin material 59 used for filling the internal portions of the through holes 49. However, there is no limitation to this. For example, the resin material 59 used for filling the internal portions of the through holes 49 does not have to be the same as the resin material forming the resin pattern 58, and may contain a conductive substance. If the internal portions of the through holes 49 are filled with a resin material containing a conductive substance, the conduction state at the through holes 49 becomes more stable.

In the configuration of the crystal resonator 1 according to Embodiment 6, the constituent components other than those described above are as in the crystal resonator 1 according to Embodiment 1, and, thus, the crystal resonator 1 according to Embodiment 6 achieves effects similar to those in the crystal resonator 1 according to Embodiment 1.

Furthermore, in the base 4 according to Embodiments 1 to 6 described above, the resin pattern 58 is formed by photolithography using a photosensitive resin material, but this is merely a preferable example, and there is no limitation to this. For example, the resin pattern 58 may be formed by applying a resin material to a position where the resin pattern 58 is to be formed. That is to say, in manufacture of the base 4 according to Embodiments 1 to 6 described above, the resin pattern 58 is formed by applying a photosensitive resin material to the two main faces 81 and 82 of the wafer 8 by dip coating or spray coating to form the resin layers 95 (see FIGS. 22A and 22B), and then light exposing and developing the resin layers 95 to form the resin pattern 58 (see FIGS. 23A and 23B), but other methods can be also used. For example, the resin pattern 58 may be formed by causing a resin to be ejected to a position where the resin pattern 58 is to be formed on the two main faces 81 and 82 of the wafer 8 by inkjet, screen printing, or dispensing. Such a resin pattern 58 formed not by photolithography may be made of a non-photosensitive resin material. Furthermore, the through holes 49 can be filled with a resin containing a conductive substance in the case of using inkjet, screen printing, or dispensing.

Here, in the base 4 according to Embodiments 1 to 6 described above, a resin material may be interposed between each of the internal electrodes 55, the external electrodes 56, and the through electrodes 57, and the substrate of the base 4 (the two main faces 42 and 43 and the inner side faces 491 of the through holes 49). That is to say, a configuration is possible in which, before the metal layers 92 are formed in the manufacturing step shown in FIGS. 14A and 14B, a resin material is applied to portions of the two main faces 81 and 82 of the wafer 8 and the inner side faces 491 of the through holes 49 at which the electrode pads 51 and 52, the external terminal electrodes 53 and 54, and the wiring patterns (i.e., the internal electrodes 55, the external electrodes 56, and the through electrodes 57) are to be formed, and the metal layers 92 are formed on the applied resin material. Accordingly, a resin material is interposed between each of the internal electrodes 55, the external electrodes 56, and the through electrodes 57, and the substrate of the base 4, and, thus, the substrate of the base 4 (e.g., substrate made of glass material) is prevented from deteriorating due to a reaction between the substrate of the base 4 and a metal forming the electrodes 55, 56, and 57.

Furthermore, regarding manufacture of the base 4 according to Embodiments 1 to 5 described above, in the step of forming the resin pattern 58 (see FIGS. 23A and 23B), the resin pattern 58 may be formed on the surface of the part of the wafer 8 that is to be cut when separating the bases 4 into each base. If the resin pattern 58 is formed on the cut portion of the wafer 8, the side face of the base 4 and the external terminal electrodes 53 and 54 can be prevented from being damaged by an external force applied when cutting the wafer 8.

Furthermore, as in the base 4 according to Embodiment 5 where electrodes constituting part of the first wiring patterns 501 are formed via the resin patterns 58 on the internal electrodes 55 constituting part of the second wiring patterns 502, another electrode may be formed via a resin pattern (resin material) on at least one of the internal electrode 55 and the external electrode 56 of the base 4 according to Embodiments 1 to 4 and 6 described above. Accordingly, a plurality of wiring patterns can be arranged in the thickness direction of the base 4.

Furthermore, in Embodiments 1 to 6, glass is used as the materials of the base 4 and the lid 6, but the materials of the base 4 and the lid 6 are not limited to glass, and, for example, quartz crystal may also be used.

Furthermore, in Embodiments 1 to 6, AuSn is mainly used as the bonding material 71, but there is no particular limitation on the bonding material 71 as long as it can bond the base 4 and the lid 6, and, for example, an Sn alloy brazing filler metal such as CuSn may also be used.

Here, in the crystal resonator 1 according to Embodiments 1 to 4 and 6 described above and the crystal oscillator 10 according to Embodiment 5, the AT-cut crystal resonator plate 2 is used as a crystal resonator plate, but a tuning-fork crystal resonator plate may also be used.

In the description above, embodiments of a case in which the electronic component package according to the present invention is applied to a crystal resonator or a crystal oscillator, but they are merely preferable embodiments, and there is no limitation on the electronic component package according to the present invention as long as an electrode of an electronic component element is sealed with sealing members that are arranged so as to oppose each other. Accordingly, the electronic component package according to the present invention may also be a piezoelectric resonator device package in which an driving electrode of a piezoelectric resonator plate made of a piezoelectric material other than quartz crystal, such as lithium tantalate or lithium niobate, is hermetically sealed with sealing members that are arranged so as to oppose each other.

The present invention may be embodied in various other forms without departing from the spirit or essential the properties thereof. The embodiments disclosed in this application are to be considered in all respects as illustrative and not limiting. The scope of the invention is indicated by the appended claims rather than by the foregoing description. All variations and modifications falling within the equivalency range of the appended claims are intended to be embraced therein.

Furthermore, this application claims priority based on Patent Application No. 2010-48099 filed in Japan on Mar. 4, 2010, the entire contents of which are herein incorporated by reference.

INDUSTRIAL APPLICABILITY

The present invention can be applied to an electronic component package in which an electrode of an electronic component element such as a piezoelectric resonator plate is hermetically sealed.

DESCRIPTION OF REFERENCE NUMERALS

1 Crystal resonator
11 Internal space
2 Crystal resonator plate
21 Base plate
22, 23 Main face
24 Center portion of a shorter side
26 Vibration portion
27 Bonding portion
31, 32 Driving electrode
33, 34 Terminal electrode
35, 36 Extraction electrode
4 Base (electronic component package sealing member functioning as first sealing member)
41 Bottom portion
411, 412 Pedestal portion
42 Main face (opposing face)
43 Main face
44 Wall portion
45, 45A First bonding layer
451, 453 Sputtered film
452, 454 Plated film
46 Cavity
461 Bottom face
47, 48 Castellation
47A, 47B, 48A, 48B Castellation
49 Through hole
491 Inner side face
492, 493 Open face
51, 52 Electrode pad
53, 54 External terminal electrode
53A, 53B, 54A, 54B External terminal electrode
55 Internal electrode
56 External electrode
561 Sputtered film
562 Plated film
563 Second plated film
57 Through electrode
58 Resin pattern
59 Resin material
6 Lid (second sealing member)
61 Second bonding layer
611 Mo film
612 Au film
71 Bonding material
711 An/Sn film
712 Au film
8 Wafer
81, 82 Main face
91 Protective layer
92 Metal layer
93 Plated layer
94 Positive resist layer
95 Resin layer
10 Crystal oscillator (electronic component package)
20 IC chip (electronic component element)
401 Pedestal portion
501 First wiring pattern
502 Second wiring pattern
503 Third wiring pattern
906, 907 Conductive bump
L1 Side along lateral direction
L2, L3 Side along longitudinal direction

The invention claimed is:

1. An electronic component package sealing member that can be used as a first sealing member in an electronic component package in which an electrode of an electronic component element is hermetically sealed with the first sealing member and a second sealing member arranged so as to oppose each other, comprising:
a through hole that passes through a substrate of the electronic component package sealing member;
an internal electrode that is formed on a face of the substrate opposing the second sealing member;
an external electrode that is formed on a face of the substrate opposite the opposing face; and
a through electrode that is formed on an inner side face of the through hole electrically connecting the internal electrode and the external electrode;
wherein at least one open face of the through hole is sealed with a resin material,
the resin material is photosensitive, and
the at least one open face of the through hole is sealed with a resin pattern made of the resin material disposed on the open face.

2. An electronic component package in which an electrode of an electronic component element is hermetically sealed with a first sealing member and a second sealing member arranged so as to oppose each other, wherein the first sealing member is the electronic component package sealing member according to claim 1.

3. The electronic component package sealing member according to claim 1, wherein an internal portion of the through hole is filled with a resin material.

4. An electronic component package sealing member that can be used as a first sealing member in an electronic component package in which an electrode of an electronic component element is hermetically sealed with the first sealing member and a second sealing member arranged so as to oppose each other, comprising:
a through hole that passes through a substrate of the electronic component package sealing member;
an internal electrode that is formed on a face of the substrate opposing the second sealing member;
an external electrode that is formed on a face of the substrate opposite the opposing face; and
a through electrode that is formed on an inner side face of the through hole electrically connecting the internal electrode and the external electrode;
wherein at least one open face of the through hole is sealed with a resin material and a surface of at least part of the internal electrode is coated with a resin material.

5. The electronic component package sealing member according to claim 1, wherein a surface of at least part of the external electrode is coated with a resin material.

6. The electronic component package sealing member according to claim 4, wherein an internal portion of the through hole is filled with a resin material.

7. The electronic component package sealing member according to claim 4, wherein a surface of at least part of the external electrode is coated with a resin material.

8. An electronic component package in which an electrode of an electronic component element is hermetically sealed with a first sealing member and a second sealing member arranged so as to oppose each other, wherein the first sealing member is the electronic component package sealing member according to claim 4.

9. An electronic component package sealing member that can be used as a first sealing member in an electronic component package in which an electrode of an electronic component element is hermetically sealed with the first sealing member and a second sealing member arranged so as to oppose each other, comprising:
- a through hole that passes through a substrate of the electronic component package sealing member;
- an internal electrode that is formed on a face of the substrate opposing the second sealing member;
- an external electrode that is formed on a face of the substrate opposite the opposing face; and
- a through electrode that is formed on an inner side face of the through hole electrically connecting the internal electrode and the external electrode;
- wherein at least one open face of the through hole is sealed with a resin material, and wherein a resin material is interposed between the substrate, and each of the internal electrode, the external electrode, and the through electrode.

10. The electronic component package sealing member according to claim 9, wherein a surface of at least part of the external electrode is coated with a resin material.

11. An electronic component package in which an electrode of an electronic component element is hermetically sealed with a first sealing member and a second sealing member arranged so as to oppose each other, wherein the first sealing member is the electronic component package sealing member according to claim 9.

12. The electronic component package sealing member according to claim 9, wherein an internal portion of the through hole is filled with a resin material.

13. An electronic component package sealing member that can be used as a first sealing member in an electronic component package in which an electrode of an electronic component element is hermetically sealed with the first sealing member and a second sealing member arranged so as to oppose each other, comprising:
- a through hole that passes through a substrate of the electronic component package sealing member;
- an internal electrode that is formed on a face of the substrate opposing the second sealing member;
- an external electrode that is formed on a face of the substrate opposite the opposing face; and
- a through electrode that is formed on an inner side face of the through hole electrically connecting the internal electrode and the external electrode;
- wherein at least one open face of the through hole is sealed with a resin material, and wherein another electrode is formed via a resin material on at least one of the internal electrode and the external electrode.

14. The electronic component package sealing member according to claim 13, wherein an internal portion of the through hole is filled with a resin material.

15. An electronic component package in which an electrode of an electronic component element is hermetically sealed with a first sealing member and a second sealing member arranged so as to oppose each other, wherein the first sealing member is the electronic component package sealing member according to claim 13.

16. The electronic component package sealing member according to claim 13, wherein a surface of at least part of the external electrode is coated with a resin material.

17. A manufacturing method for manufacturing an electronic component package sealing member that is used as a first sealing member in an electronic component package in which an electrode of an electronic component element is hermetically sealed with the first sealing member and a second sealing member arranged so as to oppose each other, comprising:
- a through hole forming step of forming a through hole that passes through a substrate of the electronic component package sealing member;
- an electrode forming step of forming, on the substrate, an internal electrode that is positioned on a face opposing the second sealing member, an external electrode that is positioned on a face opposite the opposing face, and a through electrode that is along an inner side face of the through hole; and
- a hole sealing step of sealing at least one open face of the through hole with a resin material and wherein the hole sealing step comprises a step of patterning a resin pattern for sealing at least one open face of the through hole by photolithography using the resin material that is photosensitive.

* * * * *